(12) United States Patent
Pohl et al.

(10) Patent No.: US 10,332,778 B2
(45) Date of Patent: Jun. 25, 2019

(54) LIFT PIN ASSEMBLY AND ASSOCIATED METHODS

(71) Applicant: Lam Research Corporation, Fremont, CA (US)

(72) Inventors: Erica Pohl, Sherwood, OR (US); Jeffrey Womack, Lake Oswego, OR (US); Lisa Marie Gytri, Sherwood, OR (US); Michael J. Janicki, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 491 days.

(21) Appl. No.: 14/977,554

(22) Filed: Dec. 21, 2015

(65) Prior Publication Data

US 2017/0133260 A1    May 11, 2017

Related U.S. Application Data

(60) Provisional application No. 62/253,970, filed on Nov. 11, 2015.

(51) Int. Cl.
*H01L 21/687*    (2006.01)

(52) U.S. Cl.
CPC .. *H01L 21/68742* (2013.01); *H01L 21/68764* (2013.01)

(58) Field of Classification Search
CPC .................................................. H01L 21/68742
USPC .................................. 414/672, 779, 814, 936
See application file for complete search history.

(56) References Cited

U.S. PATENT DOCUMENTS 7,750,818 B2 *    7/2010    Lee ................... H01L 21/67259
340/686.1

\* cited by examiner

*Primary Examiner* — Saul Rodriguez
*Assistant Examiner* — Willie Berry, Jr.
(74) *Attorney, Agent, or Firm* — Penilla IP, APC

(57) ABSTRACT

A substrate lift pin assembly includes a tubular support member connected to a bottom of a pedestal beneath a lift pin through-hole. The tubular support member has an interior cavity and an end closure with a cartridge through-hole extending through the end closure. A cartridge member includes a lift pin holder portion and a plunger portion. The lift pin holder portion is located inside of the interior cavity of the tubular support member. The plunger portion extends through the cartridge through-hole of the end closure of the tubular support member. A lift pin extends through the lift pin through-hole and connects to the lift pin holder portion of the cartridge member. A handle member connects to the plunger portion of the cartridge member at a location near a distal end of the plunger portion relative to the tubular support member. The handle member is configured to engage a lifting mechanism.

23 Claims, 17 Drawing Sheets

LIFT PIN ASSEMBLY AND ASSOCIATED METHODS

CLAIM OF PRIORITY

This application claims priority under 35 U.S.C. 119(e) to U.S. Provisional Patent Application No. 62/253,970, filed Nov. 11, 2015, the disclosure of which is incorporated herein by reference in its entirety.

BACKGROUND

1. Field of the Invention

The present invention relates to semiconductor device fabrication.

2. Description of the Related Art

Some modern semiconductor chip fabrication processes include positioning a substrate on a pedestal and rotating the pedestal during the processing of the substrate. Positioning of the substrate on the pedestal and removing of the substrate from the pedestal is generally performed using robotically controlled movement of an end effector device, where the end effector device is configured to interface with a bottom surface of the substrate. To avoid damaging interaction between the end effector device and the pedestal, it is often necessary to provide a vertical displacement mechanism by which the substrate can be received from the end effector device at a location above the pedestal, and by which the substrate can be lowered onto the pedestal after removal of the end effector from beneath the substrate, and by which the substrate can be raised from the pedestal to allow for positioning of the end effector beneath the substrate. The vertical displacement mechanism should be operationally reliable in order to avoid damage of the substrate, the pedestal, and/or the end effector. Therefore, the vertical displacement mechanism should be configured to avoid sticking, particularly in the presence of processing materials that may lead to such sticking. It is within this context that the present invention arises.

SUMMARY

In an example embodiment, a substrate lift pin assembly is disclosed. The substrate lift pin assembly includes a tubular support member connected to a bottom surface of a pedestal at a location below a lift pin through-hole extending through the pedestal. The pedestal has a top surface configured to support a substrate. The tubular support member has an interior cavity exposed to the lift pin through-hole. The tubular support member also has an end closure located at a distal end of the tubular support member relative to the pedestal. The end closure has a cartridge through-hole extending through the end closure. The substrate lift pin assembly also includes a cartridge member that includes a lift pin holder portion and a plunger portion secured to the lift pin holder portion. The cartridge member is partially disposed within the tubular support member such that the lift pin holder portion of the cartridge member is located inside of the interior cavity of the tubular support member and such that the plunger portion of the cartridge member extends from the lift pin holder portion of the cartridge member through the cartridge through-hole of the end closure of the tubular support member. The cartridge member is sized such that the cartridge member is freely movable within the tubular support member in a direction extending between the end closure of the tubular support member and the pedestal. The substrate lift pin assembly also includes a lift pin disposed to extend through the lift pin through-hole of the pedestal. The lift pin is configured to connect in a secured manner to the lift pin holder portion of the cartridge member inside of the interior cavity of the tubular support member such that movement of the cartridge member causes corresponding movement of the lift pin. The lift pin is configured to move freely through the lift pin through-hole of the pedestal. The substrate lift pin assembly also includes a handle member rigidly connected to the plunger portion of the cartridge member at a location near a distal end of the plunger portion of the cartridge member relative to the tubular support member, such that movement of the handle member causes corresponding movement of the cartridge member and corresponding movement of the lift pin. The handle member is configured to engage with a lifting mechanism and disengage from the lifting mechanism.

In an example embodiment, a substrate lifting system is disclosed. The substrate lifting system includes a pedestal having a top surface and a bottom surface. The top surface of the pedestal is configured to support a substrate. The pedestal is configured to rotate about a central axis extending perpendicular to the top surface of the pedestal. The pedestal includes at least three lift pin through-holes extending perpendicular to the top surface of the pedestal. The substrate lifting system also includes at least three lift pin assemblies connected to the bottom surface of the pedestal at locations respectively corresponding to the at least three lift pin through-holes of the pedestal. Each lift pin assembly includes a lift pin connected to a cartridge member, with a lift pin holder portion of the cartridge member disposed within a tubular support member, and with a plunger portion of the cartridge member extending through a cartridge through-hole formed within an end closure of the tubular support member, and with a handle member rigidly connected to the plunger portion of the cartridge member at a location near a distal end of the plunger portion of the cartridge member relative to the pedestal. The cartridge member is freely movable within the tubular support member in a direction extending between the end closure of the tubular support member and the pedestal. The substrate lifting system also includes a lift ring positioned to circumscribe the central axis about which the pedestal is configured to rotate. The lift ring includes at least three handle engagement devices positioned to simultaneously and respectively engage the handle members of the at least three lift pin assemblies when the lift ring is positioned at an engagement plane of the handle members of the at least three lift pin assemblies and when the pedestal is rotated to respectively insert the handle members of the at least three lift pin assemblies into the at least three handle engagement devices. The substrate lifting system also includes a lift ring actuator configured to provide controlled movement of the lift ring in a direction parallel to the central axis about which the pedestal is configured to rotate. The pedestal and the lift ring are configured to move independently with respect to each other.

In an example embodiment, a method is disclosed for operating a substrate lifting system. The method includes rotating a pedestal to a position at which handle members of at least three lift pin assemblies are rotationally and respectively offset from at least three handle engagement devices of a lift ring. The pedestal has a top surface and a bottom surface. The top surface of the pedestal is configured to support a substrate. The pedestal is configured to rotate about a central axis extending perpendicular to the top surface of the pedestal. The pedestal includes at least three lift pin through-holes extending perpendicular to the top surface of the pedestal. Each of the at least three lift pin assemblies is connected to the bottom surface of the pedestal at locations respectively corresponding to the at least three lift pin through-holes of the pedestal. Each lift pin assembly includes a lift pin connected to a cartridge member, with a lift pin holder portion of the cartridge member disposed within a tubular support member, and with a plunger portion of the cartridge member extending through a cartridge through-hole formed within an end closure of the tubular support member, and with a handle member rigidly connected to the plunger portion of the cartridge member at a location near a distal end of the plunger portion of the cartridge member relative to the pedestal. The cartridge member is freely movable within the tubular support member in a direction extending between the end closure of the tubular support member and the pedestal. The method also includes moving the lift ring toward the pedestal in a direction parallel to the central axis about which the pedestal is configured to rotate so as to position the lift ring at an engagement plane of the handle members of the at least three lift pin assemblies. The method also includes rotating the pedestal to cause the handle members of the at least three lift pin assemblies to respectively engage with the at least three handle engagement devices of the lift ring. The method also includes moving the lift ring toward the pedestal in a direction parallel to the central axis about which the pedestal is configured to rotate so as to cause the lift pins of the at least three lift pin assemblies to simultaneously move upward to a position above the top surface of the pedestal.

In an example embodiment, a method is disclosed for operating a substrate lifting system. The method includes rotating a pedestal to a position at which handle members of at least three lift pin assemblies are positioned to respectively engage with at least three handle engagement devices of a lift ring. The pedestal has a top surface and a bottom surface. The top surface of the pedestal is configured to support a substrate. The pedestal is configured to rotate about a central axis extending perpendicular to the top surface of the pedestal. The pedestal includes at least three lift pin through-holes extending perpendicular to the top surface of the pedestal. Each of the at least three lift pin assemblies is connected to the bottom surface of the pedestal at locations respectively corresponding to the at least three lift pin through-holes of the pedestal. Each lift pin assembly includes a lift pin connected to a cartridge member with a lift pin holder portion of the cartridge member disposed within a tubular support member, and with a plunger portion of the cartridge member extending through a cartridge through-hole formed within an end closure of the tubular support member, and with a handle member rigidly connected to the plunger portion of the cartridge member at a location near a distal end of the plunger portion of the cartridge member relative to the pedestal. The cartridge member is freely movable within the tubular support member in a direction extending between the end closure of the tubular support member and the pedestal. The method also includes moving the lift ring toward the pedestal in a direction parallel to the central axis about which the pedestal is configured to rotate so as to cause movement of the lift pins of the at least three lift pin assemblies to a position above the pedestal. The method also includes positioning a substrate on the lift pins of the at least three lift pin assemblies. The method also includes moving the lift ring away from the pedestal in the direction parallel to the central axis about which the pedestal is configured to rotate so as to cause retraction of the lift pins of the at least three lift pin assemblies into the lift pin through-holes of the pedestal. The method also includes positioning the lift ring so that each of the handle members of the at least three lift pin assemblies is positioned within a slot of its handle engagement device and vertically away from interior surfaces of its handle engagement device. The method also includes rotating the pedestal such that the handle members of the at least three lift pin assemblies move freely through the slots of the at least three handle engagement devices.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

A substrate lift pin assembly, an associated substrate lifting system, and associated methods of operation are described herein to provide for improvement in positioning of a substrate on a pedestal and removal of the substrate from the pedestal as part of a semiconductor device fabrication process. In an example embodiment, the term substrate as used herein refers to a semiconductor wafer. However, it should be understood that in other embodiments, the term substrate as used herein can refer to substrates formed of sapphire, GaN, GaAs or SiC, or other substrate materials, and can include glass panels/substrates, metal foils, metal sheets, polymer materials, or the like. Also, in various embodiments, the substrate as referred to herein may vary in form, shape, and/or size. For example, in some embodiments, the substrate as referred to herein may correspond to a 200 mm (millimeters) semiconductor wafer, a 300 mm semiconductor wafer, or a 450 mm semiconductor wafer. Also, in some embodiments, the substrate as referred to herein may correspond to a non-circular substrate, such as a rectangular substrate for a flat panel display, or the like, among other shapes.

Figure 1A:
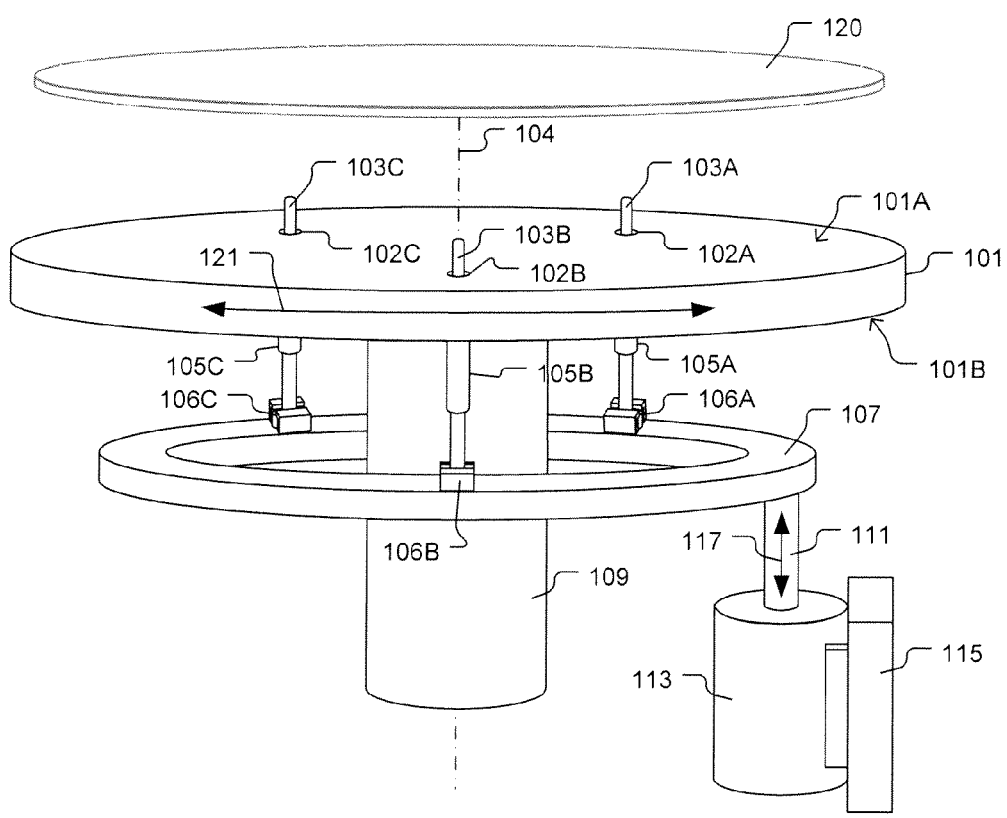
FIG. 1A shows a pedestal and a substrate lifting system, in accordance with some embodiments of the present invention.

FIG. 1A shows a pedestal 101 and a substrate lifting system, in accordance with some embodiments of the present invention. The pedestal 101 has a top surface 101A configured to support a substrate 120 during processing. The pedestal 101 also has a bottom surface 101B to which at least three lift pin assemblies 105A, 105B, 105C are connected. In some embodiments, the pedestal 101 is formed of aluminum nitride, aluminum, or stainless steel, among other materials, so long as the material of the pedestal 101 is compatible with the processing environment and provides adequate strength. The pedestal 101 is connected to a rotation module 109, which is configured to rotate the pedestal 101 about a central axis 104 extending perpendicular to the top surface 101A of the pedestal 101, as indicated by arrow 121. In various embodiments, the pedestal 101 can be rotated clockwise, counter-clockwise, or both clockwise and counter-clockwise. The rotation module 109 includes a shaft/hub connected to the pedestal 101 with a motor and corresponding linkage configured to rotate the shaft/hub, and correspondingly rotate the pedestal 101, in a controlled manner. In some embodiments, the pedestal 101 is configured to remain at a fixed location in a direction along the central axis 104. It should be understood that the at least three lift pin assemblies 105A, 105B, 105C move with the pedestal 101 as the pedestal 101 is rotated.

The pedestal 101 includes at least three lift pin through-holes 102A, 102B, 102C extending through the pedestal 101 in a direction perpendicular to the top surface 101A of the pedestal 101, i.e., in a direction parallel to the central axis 104 about which the pedestal 101 rotates. The at least three lift pin assemblies 105A, 105B, and 105C are connected to the bottom surface 101B of the pedestal 101 at locations respectively corresponding to the at least three lift pin through-holes 102A, 102B, 102C of the pedestal 101. Each lift pin assembly 105A, 105B, 105C includes a corresponding lift pin 103A, 103B, 103C. The lift pins 103A, 103B, 103C are configured to interface with a bottom surface of the substrate 120 to provide for receipt of the substrate 120 from an end effector device at a location above the pedestal 101, and to provide for lowering of the substrate 120 onto the top surface 101A of the pedestal 101 after removal of the end effector device, and to provide for raising of the substrate 120 from the top surface 101A of the pedestal 101 to a location above the pedestal 101 to allow for positioning of the end effector beneath the substrate 120.

In some embodiments, the lift pins 103A, 103B, 103C are formed of sapphire, alumina, stainless steel, or quartz, among other materials, so long as the material of the lift pins 103A, 103B, 103C is compatible with the processing environment, provides adequate strength, and has a suitable coefficient of friction to enable smooth movement of the lift pins 103A, 103B, 103C through the corresponding lift pin through-holes 102A, 102B, 102C within the pedestal 101. Also, in some embodiments the pedestal 101 can include guide bushings to ensure smooth travel of the lift pins 103A, 103B, 103C through the lift pin through-holes 102A, 102B, 102C. In some embodiments, these guide bushings are formed of sapphire, alumina, stainless steel, or quartz, among other materials, so long as the material of the guide bushings is compatible with the processing environment, provides adequate strength, and has a suitable coefficient of friction.

Figure 1B:
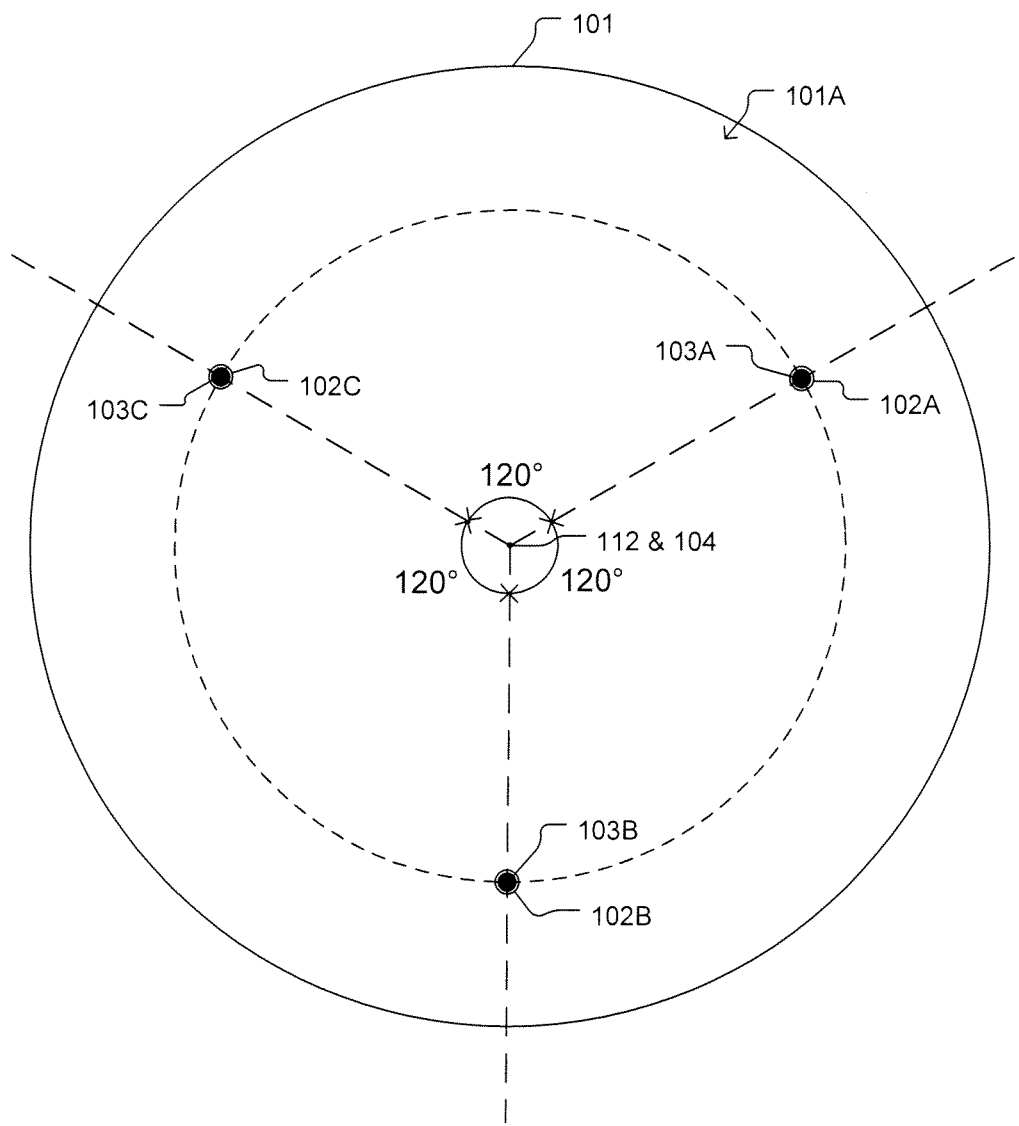
FIG. 1B shows a top view of the pedestal, in accordance with some embodiments of the present invention.

FIG. 1B shows a top view of the pedestal 101, in accordance with some embodiments of the present invention. As shown in FIG. 1B, the lift pin through-holes 102A, 102B, 102C are positioned about a same distance from a centerpoint 112 of the top surface 101A of the pedestal 101, where the central axis 104 about which the pedestal 101 rotates extends through the centerpoint 112. Also, in some embodiments, the lift pin through-holes 102A, 102B, 102C are positioned in a substantially equidistant azimuthal manner about the central axis 104. For instance, in the example embodiment of FIG. 1B, each adjacent pair of the three lift pin through-holes 102A, 102B, 102C are separated by an angle of about 120° as measured within the plane of the top surface 101A of the pedestal 101 about the central axis 104. It should be understood, however, that other embodiments can have more than three lift pin through-holes 102A, 102B, 102C, and in doing so can have the lift pin through-holes separated by varying amounts so long as the substrate is adequately and securely supported by the lift pins that extend through the lift pin through-holes.

FIG. 1A also shows a lift ring 107 positioned to circumscribe the central axis 104 about which the pedestal 101 is configured to rotate. The lift ring 107 includes at least three handle engagement devices 106A, 106B, and 106C positioned to simultaneously and respectively engage handle members of the at least three lift pin assemblies 105A, 105B, and 105C, when the lift ring 107 is positioned at an engagement plane of the handle members of the at least three lift pin assemblies 105A, 105B, 105C, and when the pedestal 101 is rotated to respectively insert the handle members of the at least three lift pin assemblies 105A, 105B, 105C into the at least three handle engagement devices 106A, 106B, 106C. In some embodiments, the lift ring 107 is formed of a ceramic material or other type of material that is compatible with the processing environment, provides adequate strength, and has an appropriate coefficient of thermal expansion that avoids adverse dimensional distortion of the lift ring 107 during processing operations. Also, in some embodiments, the handle engagement devices 106A, 106B, 106C are formed of aluminum nitride, aluminum, or stainless steel, among other materials, so long as the material of the handle engagement devices 106A, 106B, 106C is compatible with the processing environment and provides adequate strength.

The lift ring 107 is rigidly connected to a lift ring actuator 111, which is configured to provide controlled movement of the lift ring 107 in a direction parallel to the central axis 104 about which the pedestal 101 is configured to rotate, as indicated by arrow 117. In some embodiments, the lift ring actuator 111 is connected to a drive motor 113, with the drive motor 113 in turn connected to a fixed mount 115. In this manner, operation of the motor 113 to move the lift ring actuator 111, as indicated by arrow 117, causes movement of the lift ring 107 relative to the pedestal 101 in the direction parallel to the central axis 104. It should be understood that the pedestal 101 and the lift ring 107 are configured to move independently with respect to each other. And, in particular, the lift ring 107 does not rotate in conjunction with rotation of the pedestal 101.

Figure 2A:
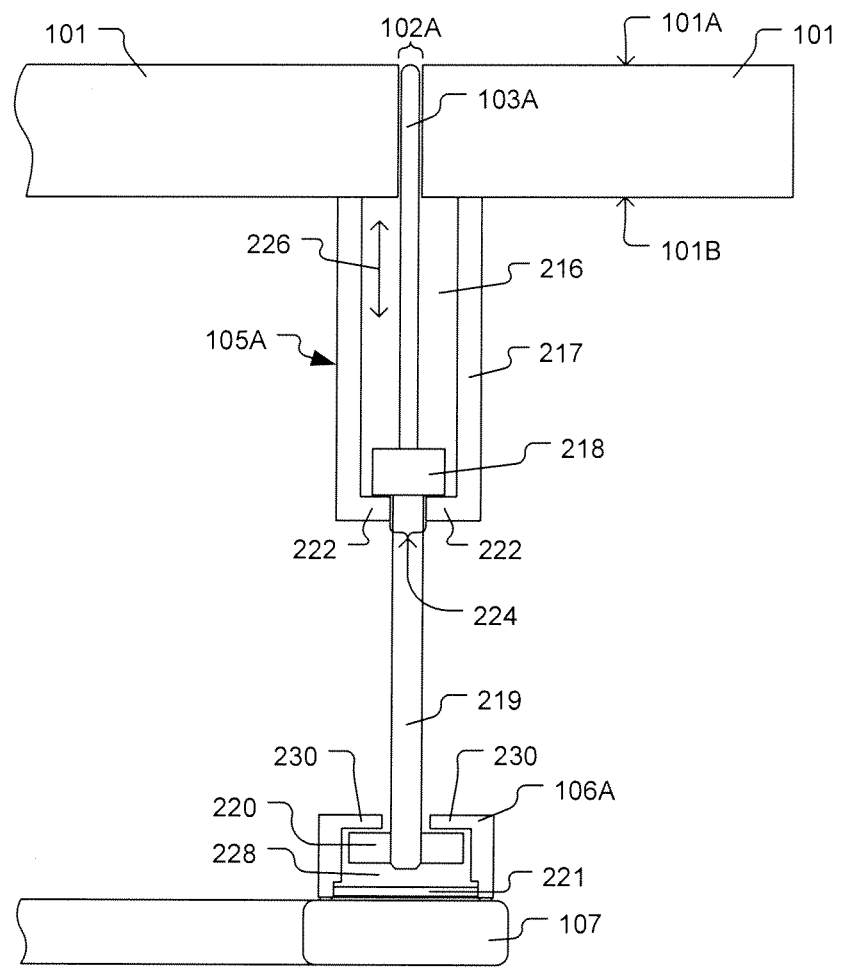
FIG. 2A shows a vertical cross-section view through the lift pin assembly, in accordance with some embodiments of the present invention.

FIG. 2A shows a vertical cross-section view through the lift pin assembly 105A, in accordance with some embodiments of the present invention. It should be understood that each of the at least three lift pin assemblies 105A, 105B, 105C are configured the same. The lift pin assembly 105A includes a tubular support member 217 connected to the bottom surface 101B of the pedestal 101 at a location below the lift pin through-hole 102A extending through the pedestal 101. The tubular support member 217 has an interior cavity 216 exposed to the lift pin through-hole 102A. The tubular support member 217 has an end closure 222 located at a distal end of the tubular support member 217 relative to the pedestal 101. The end closure 222 has a cartridge through-hole 224 extending through the end closure 222. In some embodiments, the tubular support member 217 is formed of sapphire, alumina, stainless steel, or quartz, among other materials, so long as the material of the tubular support member 217 is compatible with the processing environment, provides adequate strength, and has a suitable coefficient of friction.

The lift pin assembly 105A also includes a cartridge member that includes a lift pin holder portion 218 and a plunger portion 219 secured to the lift pin holder portion 218. The cartridge member is partially disposed within the tubular support member 217 such that the lift pin holder portion 218 of the cartridge member is located inside of the interior cavity 216 of the tubular support member 217, and such that the plunger portion 219 of the cartridge member extends from the lift pin holder portion 218 of the cartridge member through the cartridge through-hole 224 of the end closure 222 of the tubular support member 217. The cartridge member is sized such that the cartridge member, i.e., the combination of the lift pin holder portion 218 and the plunger portion 219, is freely movable within the tubular support member 217 in a direction 226 extending between the end closure 222 of the tubular support member 217 and the pedestal 101. More specifically, the plunger portion 219 of the cartridge member is sized smaller than the cartridge through-hole 224 of the end closure 222 of the tubular support member 217 such that the plunger portion 219 of the cartridge member is freely movable through the cartridge through-hole 224 of the end closure 222 of the tubular support member 217. Also, the lift pin holder portion 218 of the cartridge member is sized larger than the cartridge through-hole 224 of the end closure 222 of the tubular support member 217 such that the end closure 222 of the tubular support member 217 is a hard stop to movement of the lift pin holder portion 218 of the cartridge member within the interior cavity 216 of the tubular support member 217.

In some embodiments, the plunger portion 210 and the lift pin holder portion 218 of the cartridge member are formed together as a single component. In some embodiments, the plunger portion 210 and the lift pin holder portion 218 of the cartridge member are formed as physically separate components that are connected together, such as through a threaded connection. In some embodiments, the plunger portion 210 and the lift pin holder portion 218 of the cartridge member are formed of Haynes 242, inconel, or stainless steel, among other materials, so long as the material of the plunger portion 210 and the lift pin holder portion 218 of the cartridge member is compatible with the processing environment, provides adequate strength, and has a suitable coefficient of friction.

The lift pin 103A is disposed to extend through the lift pin through-hole 102A of the pedestal 101. The lift pin 103A is configured to connect in a secured manner to the lift pin holder portion 218 of the cartridge member inside of the interior cavity 216 of the tubular support member 217, such that movement of the cartridge member, i.e., the combination of the lift pin holder portion 218 and the plunger portion 219, causes corresponding movement of the lift pin 103A. The lift pin 103A is configured to move freely through the lift pin through-hole 102A of the pedestal 101.

The lift pin assembly 105A also includes a handle member 220 rigidly connected to the plunger portion 219 of the cartridge member at a location near a distal end of the plunger portion 210 of the cartridge member relative to the tubular support member 217, such that movement of the handle member 220 causes corresponding movement of the cartridge member, i.e., of the combination of the lift pin holder portion 218 and the plunger portion 219, and corresponding movement of the lift pin 103A. In some embodiments, the handle member 220 is connected to the plunger portion 219 of the cartridge member by a threaded connection. However, in other embodiments, the handle member 220 can be connected to the plunger portion 219 of the cartridge member by pinned connection or snap-on connection, or essentially any other type of connection that provides for rigid connection of the handle member 220 to the plunger portion 219 of the cartridge member. In some embodiments, the handle member 220 is formed of stainless steel, Haynes 242, or aluminum, among other materials, so long as the material of the handle member 220 is compatible with the processing environment and provides adequate strength.

The handle member 220 is configured to engage with a lifting mechanism and disengage from the lifting mechanism, where the lifting mechanism is defined by a combination of the handle engagement device 106A and the lift ring 107. More specifically, in some embodiments, the handle member 220 is configured to enter a slot 228 of the handle engagement device 106A of the lifting mechanism as the substrate lift pin assembly 105A moves in conjunction with rotation of the pedestal 101. And, the handle member 220 is configured to exit the slot 228 of the handle engagement device 106A of the lifting mechanism as the substrate lift pin assembly 105A moves in conjunction with rotation of the pedestal 101. The lifting mechanism can also include one or more shims 221 disposed on top of the lift ring 107 within the handle engagement device 106A to provide for substantially simultaneous movement of the lift pins 103A, 103B, 103C of the three lift pin assemblies 105A, 105B, 105C in the upward direction toward the pedestal 101 as the lift ring 107 is moved upward toward the pedestal 101. The shims 221 can be placed in the handle engagement devices 106A, 106B, 106C as needed to compensate for any non-parallel relationship between a top surface 107A of the lift ring 107 and the top surface 101A of the pedestal 101. The shims 221 control the vertical distance of each lift pin 103A, 103B, 103C above the pedestal 101 when the lift pins 103A, 103B, 103C are fully raised. In some embodiments, the shims 221 are formed of sapphire or quartz, among other materials, so long as the material of the shims 221 is compatible with the processing environment, provides adequate strength, and has a sufficient coefficient of friction to avoid lateral dragging of the plunger portion 219 when in contact with shim 221.

Figure 2B:
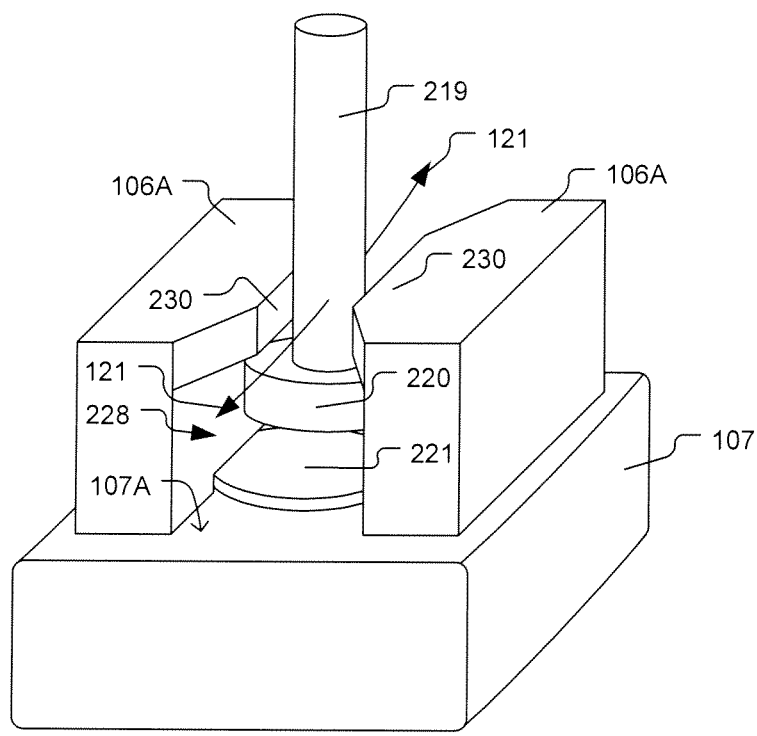
FIG. 2B shows a view of the engagement between the handle member and the handle engagement device, in accordance with some embodiments of the present invention.

FIG. 2B shows a view of the engagement between the handle member 220 and the handle engagement device 106A, in accordance with some embodiments of the present invention. The handle engagement device 106A is configured to form the slot 228 through which the handle member 220 travels as the pedestal 101 is rotated, as indicated by arrows 121. In some embodiments, the handle engagement device 106A is defined by two identical parts that install into the lift ring 107. During raising and lowering of the lift pins 103A, 103B, 103C, the pedestal 101 is rotated to an engagement position in which the handle member 220 is positioned within the handle engagement device 106A. In the engagement position, as the lift ring 107 is raised, the lift ring 107 (or shim 221, if present) will contact the bottom of the plunger portion 219 of the cartridge member and raise the plunger portion 219 which in turn raises the lift pin holder portion 218 of the cartridge member which in turn raises the lift pin 103A. Also, in the engagement position, as the lift ring 107 is lowered from its raised position, the combination of the plunger portion 219 of the cartridge member, the lift pin holder portion 218 of the cartridge member, and the lift pin 103A should lower together in conjunction with the lift ring 107 under the force of gravity. However, if the lift pin 103A is stuck, as the lift ring 107 is lowered, an upper flange portion 230 of the handle engagement device 106A will eventually contact a top surface of the handle member 220 and apply a downward force to the handle member 220 to pull the stuck lift pin 103A down by way of the linkage through the plunger portion 219 of the cartridge member and the lift pin holder portion 218 of the cartridge member.

Figure 2C:
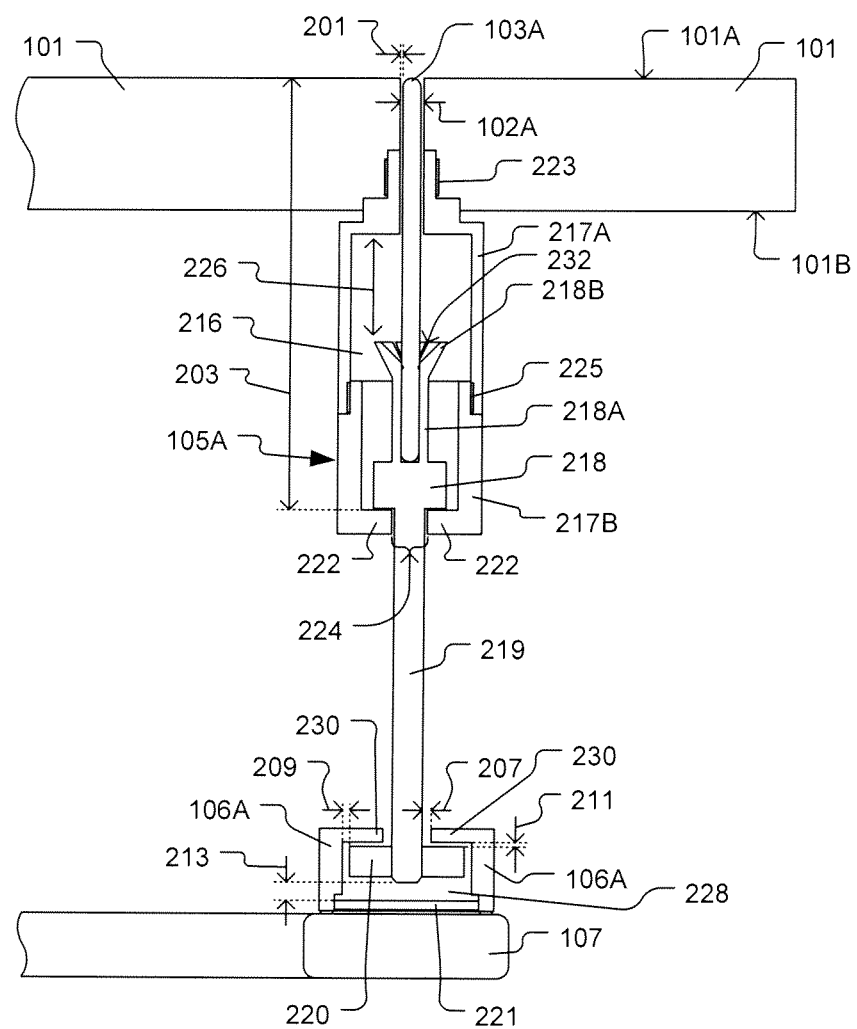
FIG. 2C shows an alternate embodiment of the lift pin assembly of FIG. 2A, in accordance with some embodiments of the present invention.

FIG. 2C shows an alternate embodiment of the lift pin assembly 105A of FIG. 2A, in accordance with some embodiments of the present invention. In the embodiment of FIG. 2C, the tubular support member 217 includes a guide portion 217A and a retainer portion 217B. The guide portion 217A has a first end attachable to the bottom surface 101B of the pedestal 101 and detachable from the bottom surface 101B of the pedestal 101. In some embodiments, the first end of the guide portion 217A is configured to have a threaded connection 223 with the pedestal 101. The retainer portion 217B has a first end attachable to a second end of the guide portion 217A and detachable from the second end of the guide portion 217A. In some embodiments, the second end of the guide portion 217A and the first end of the retainer portion 217B are configured to have a threaded connection 225 with each other. Also, a second end of the retainer portion 217B has the end closure 222 of the tubular support member 217. In some embodiments, each of the guide portion 217A and the retainer portion 217B is formed of sapphire, alumina, stainless steel, or quartz, among other materials, so long as the material of the guide portion 217A and the retainer portion 217B is compatible with the processing environment, provides adequate strength, and has a suitable coefficient of friction.

Figure 2D:
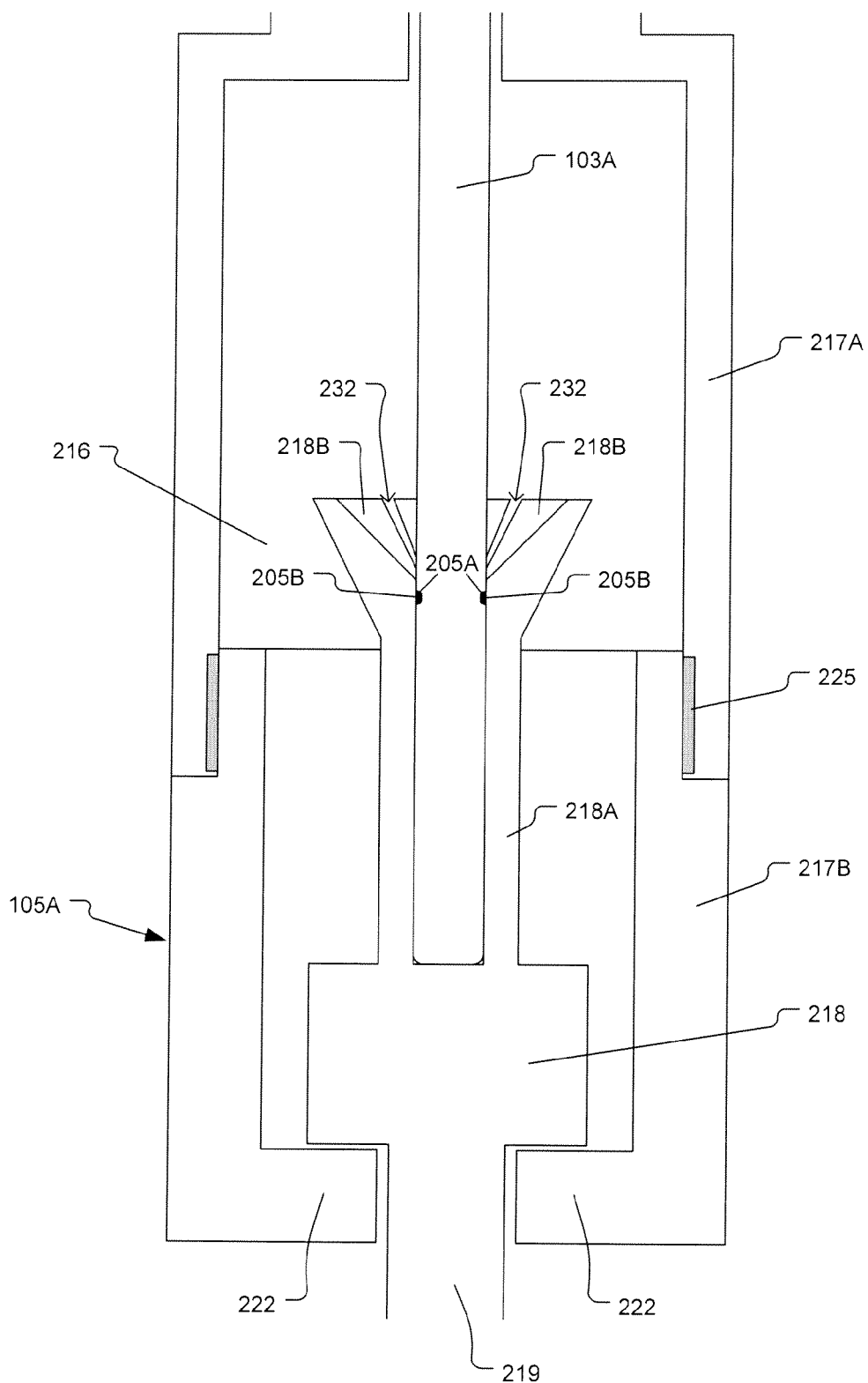
FIG. 2D shows a close-up view of the receptacle, in accordance with some embodiments of the present invention.

In the embodiment of FIG. 2C, the lift pin holder portion 218 of the cartridge member includes a receptacle 218A configured to provide a snap-in connection with the lift pin 103A. FIG. 2D shows a close-up view of the receptacle 218A, in accordance with some embodiments of the present invention. In some embodiments, the receptacle 218A has a funnel shaped opening 2188 for receipt of the lift pin 103A. A portion of the lift pin 103A configured to engage the receptacle 218A includes a channel 205A defined to circumscribe the lift pin 103A. The receptacle 218B correspondingly includes a number of locking tabs 205B configured to engage the channel 205A of the lift pin 103A to provide the snap-in connection with the lift pin 103A. In some embodiments, the funnel shaped opening 2188 of the receptacle 218A is fluted, as indicated by cuts 232, to impart flexibility to the receptacle 218A to enable insertion of the lift pin 103A within the receptacle 218A in the presence of the locking tabs 205B.

Figure 2E:
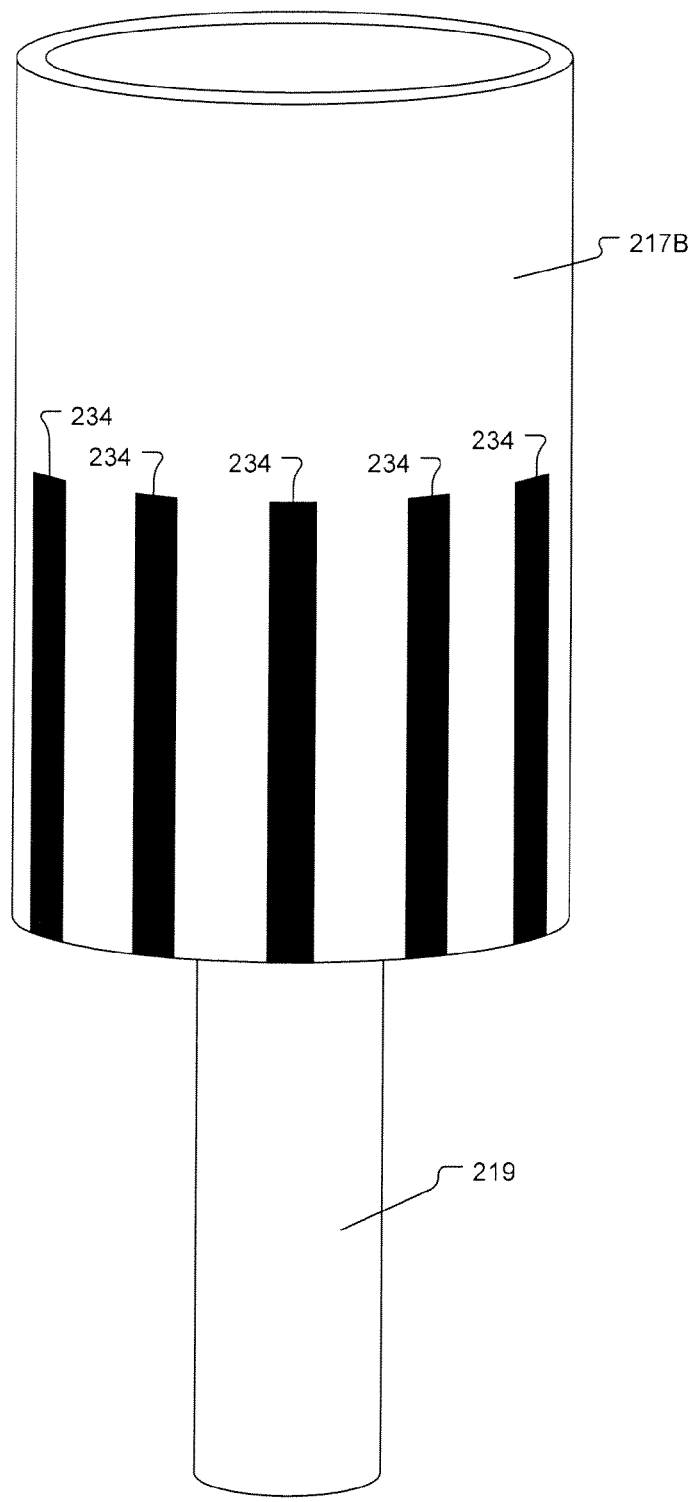
FIG. 2E shows an outer view of the retainer portion of the tubular support member, in accordance with some embodiments of the present invention.

FIG. 2E shows an outer view of the retainer portion 217B of the tubular support member 217, in accordance with some embodiments of the present invention. In the embodiment of FIG. 2E, the retainer portion 217B includes a number of slots 234 formed through a sidewall of the retainer portion 217B of the tubular support member 217 at a location near the distal end of the retainer portion 217B of the tubular support member 217 relative to the pedestal 101. The number of slots 234 provide a corresponding number of fluid pathways between the interior cavity 216 of the tubular support member 217 and an environment outside of the tubular support member 217. In this manner, process materials that find their way into the interior cavity 216 of the tubular support member 217 can exit the interior cavity 216 of the tubular support member 217 through the slots 234.

With reference back to FIG. 2C, a number of gaps and clearances are maintained to ensure lateral stability of the lift pin 103A and free movement of the lift pin 103A in the vertical direction toward and away from the pedestal 101. In some embodiments, a clearance 201 between the lift pin 103A and the pedestal 101 is within a range extending from about 0.003 inch to about 0.02 inch. This clearance 201 determines an amount by with the lift pin 103A is allowed to tilt when being raised and lowered, and affects a likelihood of the lift pin 103A binding, i.e., getting stuck. In some embodiments, a distance 203 between the top surface/inside surface of the end closure 222 of the tubular support member 217 and the top surface 101A of the pedestal 101 is within a range extending from about 2 inches to about 4 inches. Given a total length of the combination of the lift pin 103A and the lift pin holder portion 218, the distance 203 sets a depth of the lift pin 103A within the pedestal 101 when the lift pin 103A is fully lowered.

In some embodiments, a clearance 207 between the plunger portion 219 and the upper flange portion 230 of the handle engagement device 106A is within a range extending from about 0.02 inch to about 0.25 inch. The clearance 207 provides for unobstructed movement of the plunger portion 219 through/into the handle engagement device 106A. In some embodiments, a clearance 209 between the handle member 220 and the body of the handle engagement device 106A is within a range extending from about 0.02 inch to about 0.25 inch. The clearance 209 provides for unobstructed movement of the handle member 220 through/into the handle engagement device 106A.

In some embodiments, a distance 211 between the top surface of the handle member 220 and the bottom surface of the flange portion 230 of the handle engagement device 106A, when the pedestal 101 is rotated to the engagement position in which the handle member 220 is positioned within the handle engagement device 106A, is within a range extending from about 0.02 inch to about 0.1 inch. The distance 211 provides for unobstructed movement of the handle member 220 through/into the handle engagement device 106A. Also, the distance 211 sets a vertical travel amount that the lift pin 103A can stick before it is pulled downward by the linkage through the lift pin holder portion 218, the plunger portion 219, and the handle member 220.

In some embodiments, a distance 213 between the lower end of the plunger portion 219 and the top surface of the shim 221 (or the top surface of the lift ring 107 when the shim 221 is not present), when the pedestal 101 is rotated to the engagement position in which the handle member 220 is positioned within the handle engagement device 106A, is within a range extending from about 0.02 inch to about 0.1 inch. The distance 213 provides for unobstructed movement of the handle member 220 through/into the handle engagement device 106A. The distance 213 also sets a height of the lift pin 103A above the pedestal 101 when the lift pin 103A is fully raised.

Figure 3:
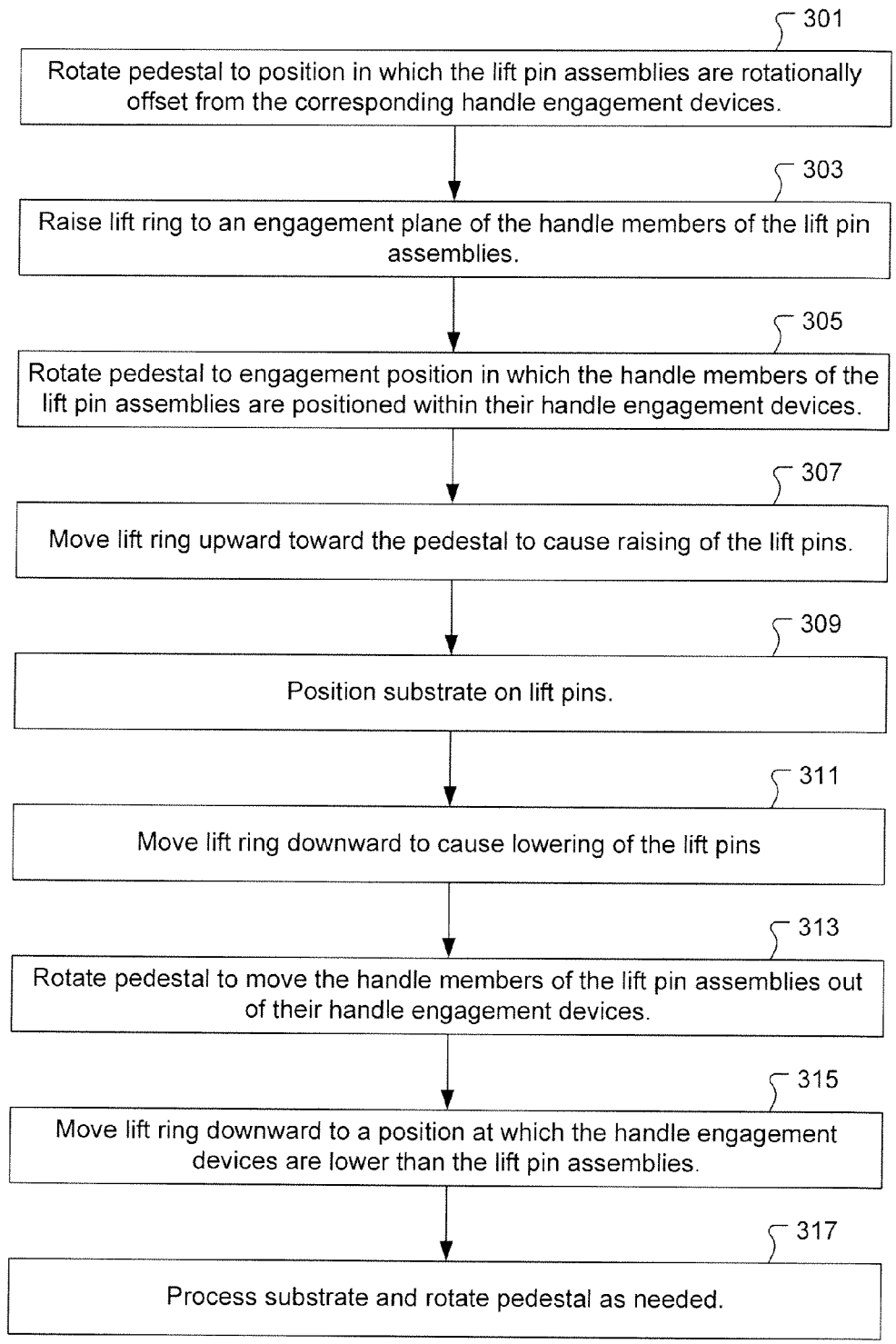
FIG. 3 shows a flowchart of a method for operating the substrate lifting system as described with regard to FIGS. 1A-2E, in accordance with various embodiments of the present invention.
Figure 4A:
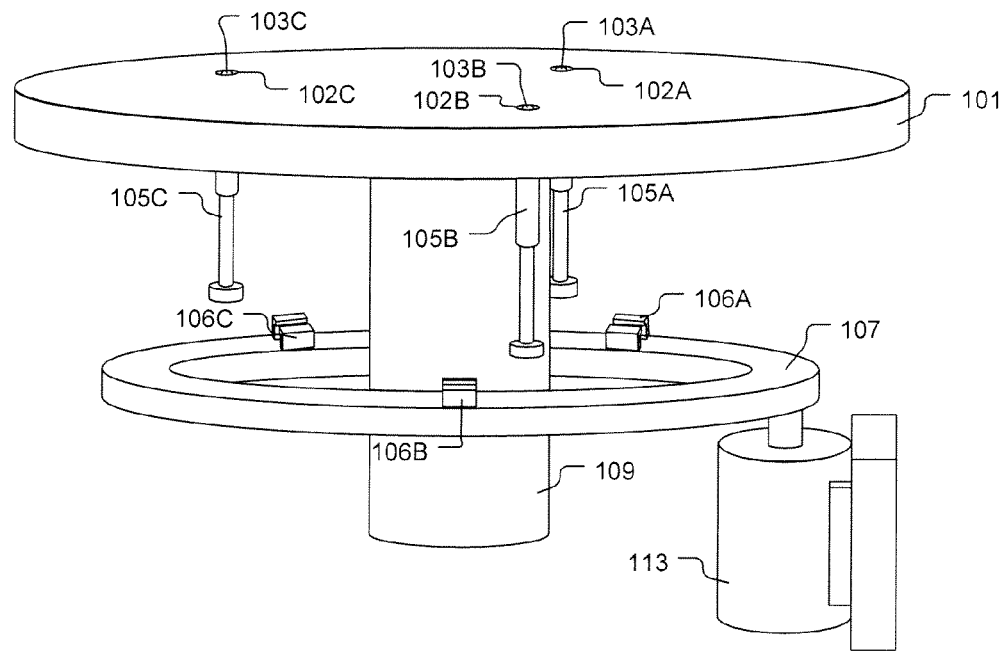
FIG. 4A shows the state of the substrate lifting system in operation 301 of the method of FIG. 3, in accordance with some embodiments of the present invention.

FIG. 3 shows a flowchart of a method for operating the substrate lifting system as described with regard to FIGS. 1A-2E, in accordance with various embodiments of the present invention. FIGS. 4A-4I depict the substrate lifting system in various operations of the method of FIG. 3, in accordance with various embodiments of the present invention. The method includes an operation 301 in which the pedestal 101 is rotated to a position in which the lift pin assemblies 105A, 105B, 105C are rotationally offset from the corresponding handle engagement devices 106A, 106B, 106C. FIG. 4A shows the state of the substrate lifting system in operation 301, in accordance with some embodiments of the present invention.

Figure 4B:
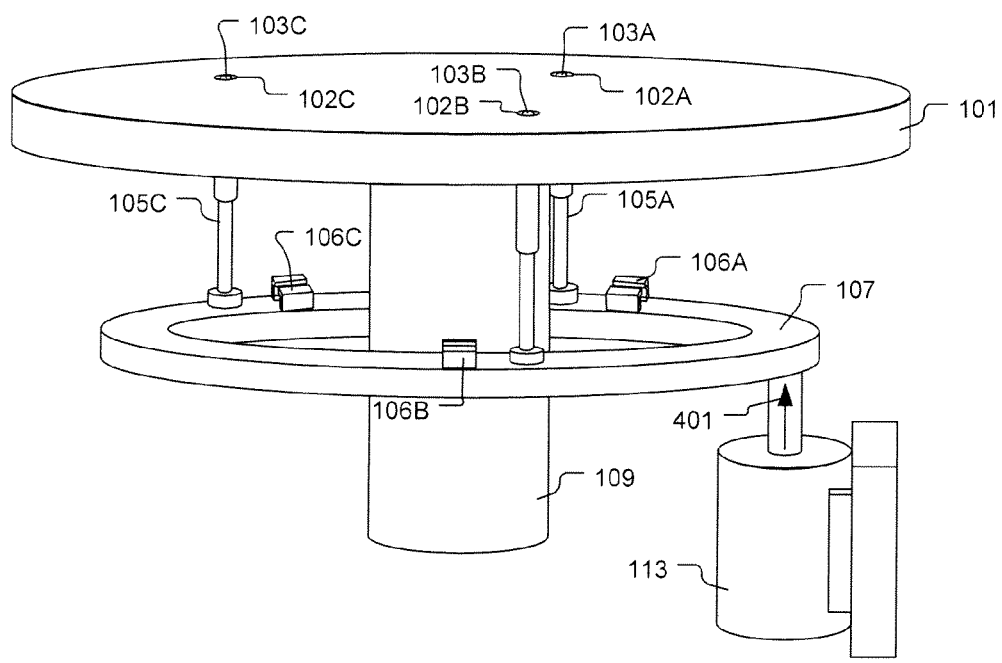
FIG. 4B shows the state of the substrate lifting system in operation 303 of the method of FIG. 3, in accordance with some embodiments of the present invention.

From the operation 301, the method continues with an operation 303 in which the lift ring 107 is raised to an engagement plane of the handle members 220 of the lift pin assemblies 105A, 105B, 105C, where the engagement plane corresponds to a location of the handle members 220 of the lift pin assemblies 105A, 105B, 105C when the lift pin holder portions 218 of the cartridge members of the lift pin assemblies 105A, 105B, 105C are in contact with the respective end closures 222 of the tubular support members 217 of the lift pin assemblies 105A, 105B, 105C. FIG. 4B shows the state of the substrate lifting system in operation 303, in accordance with some embodiments of the present invention. The raising of the lift ring 107 in operation 303 is represented by the arrow 401.

Figure 4C:
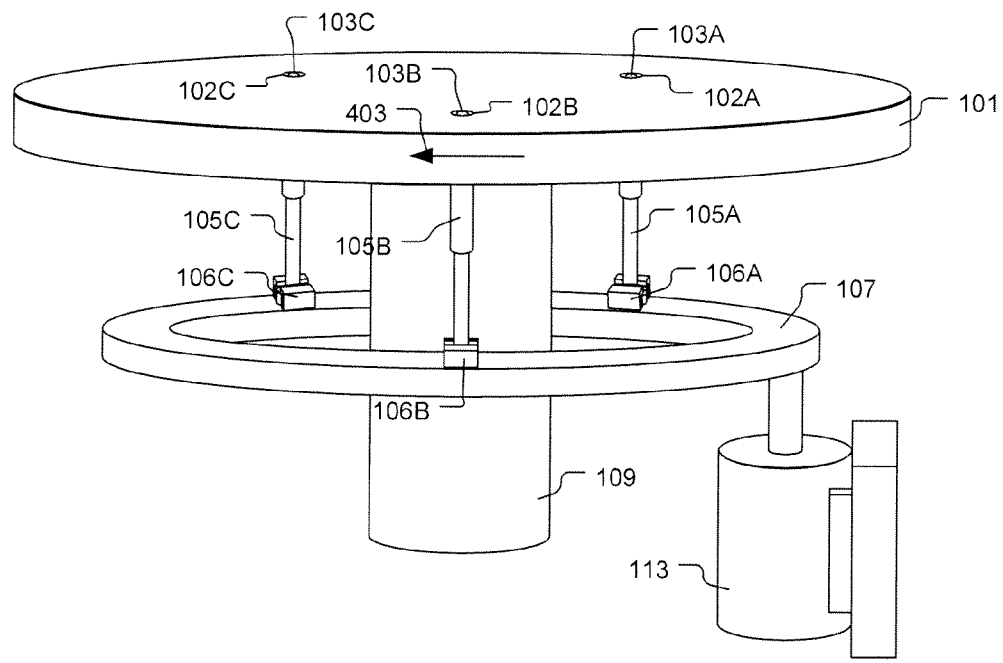
FIG. 4C shows the state of the substrate lifting system in operation 305 of the method of FIG. 3, in accordance with some embodiments of the present invention.

From the operation 303, the method continues with an operation 305 in which the pedestal 101 is rotated to the engagement position in which the handle members 220 of the lift pin assemblies 105A, 105B, 105C are positioned within their respective handle engagement devices 106A, 106B, 106C. FIG. 4C shows the state of the substrate lifting system in operation 305, in accordance with some embodiments of the present invention. The rotation of the pedestal 101 in operation 305 is represented by the arrow 403.

Figure 4D:
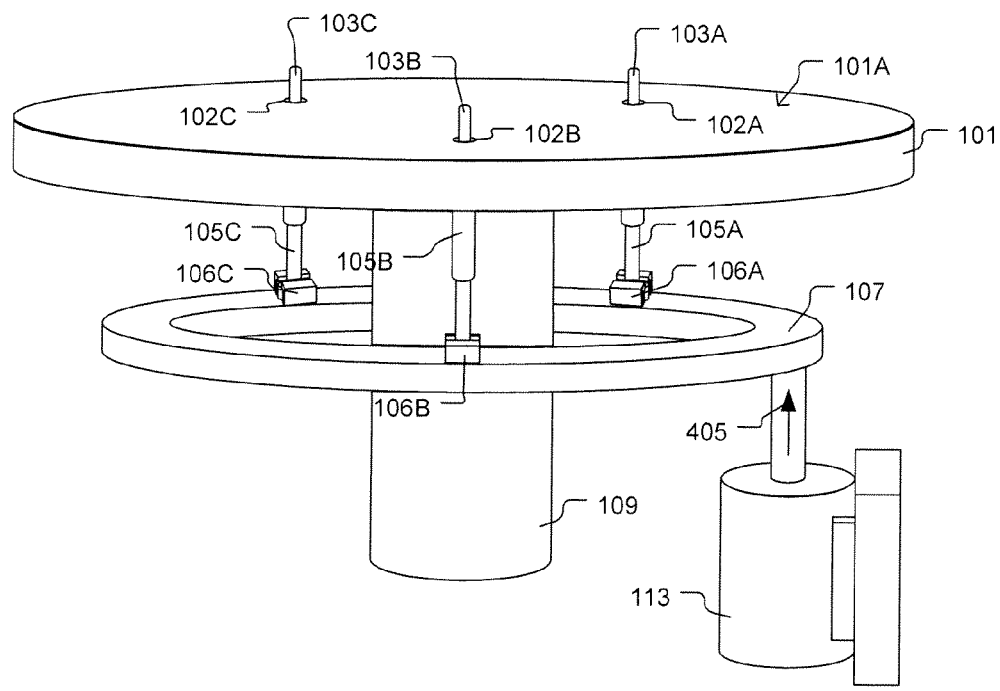
FIG. 4D shows the state of the substrate lifting system in operation 307 of the method of FIG. 3, in accordance with some embodiments of the present invention.
Figure 4E:
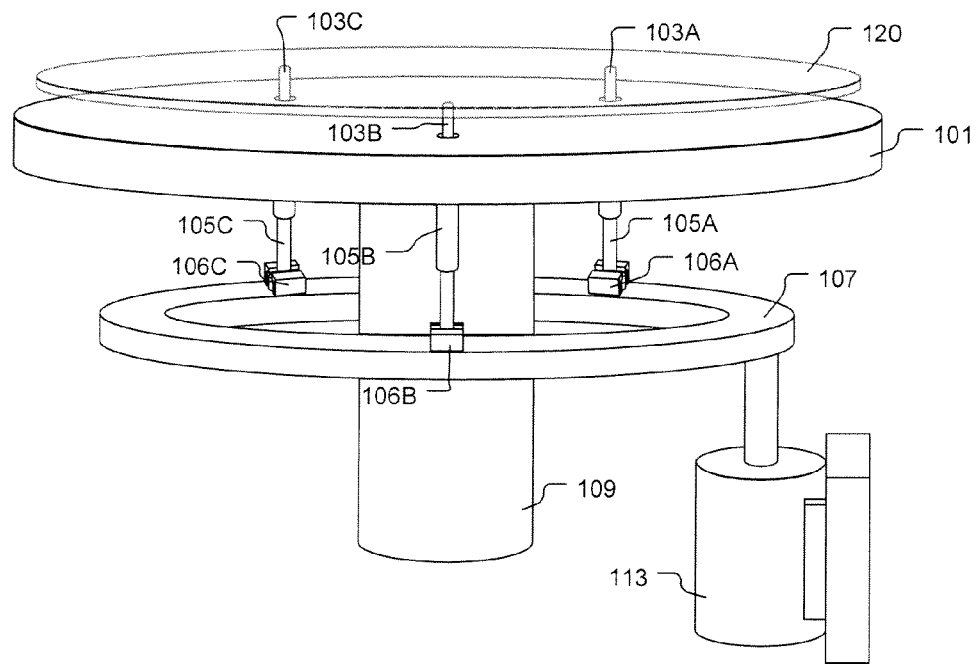
FIG. 4E shows the state of the substrate lifting system in operation 309 of the method of FIG. 3, in accordance with some embodiments of the present invention.

From the operation 305, the method continues with an operation 307 in which the lift ring 107 is moved upward from the engagement plane of the handle members 220 of the lift pin assemblies 105A, 105B, 105C toward the pedestal 101, with the handle engagement devices 106A, 106B, 106C positioned to simultaneously and respectively engage the lift pin assemblies 105A, 105B, 105C causing simultaneous upward movement of the lift pins 103A, 103B, 103C above the top surface 101A of the pedestal 101. FIG. 4D shows the state of the substrate lifting system in operation 307, in accordance with some embodiments of the present invention. The upward movement of the lift ring 107 in operation 307 is represented by the arrow 405. From the operation 307, the method continues with an operation 309 in which the substrate 120 is positioned on the lift pins 103A, 103B, 103C. FIG. 4E shows the state of the substrate lifting system in operation 309, in accordance with some embodiments of the present invention.

Figure 4F:
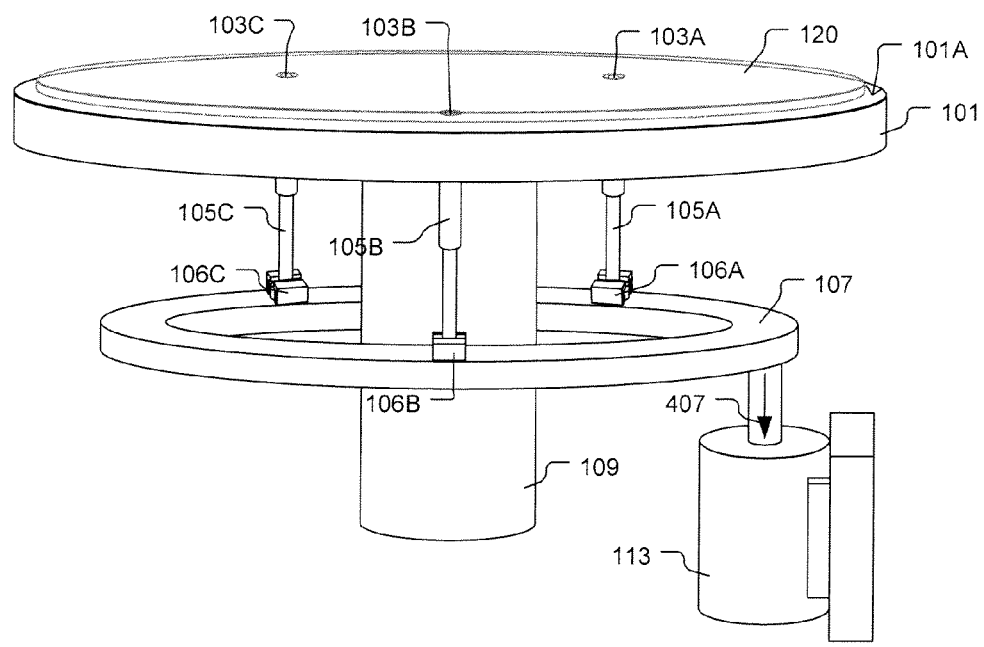
FIG. 4F shows the state of the substrate lifting system in operation 311 of the method of FIG. 3, in accordance with some embodiments of the present invention.

From the operation 309, the method continues with an operation 311 in which the lift ring 107 is moved downward toward the engagement plane of the handle members 220 of the lift pin assemblies 105A, 105B, 105C, with the handle engagement devices 106A, 106B, 106C positioned to simultaneously and respectively engage the handle members 220 of the lift pin assemblies 105A, 105B, 105C to cause simultaneous downward movement of the lift pins 103A, 103B, 103C, such that the substrate 120 is brought to rest on the top surface 101A of the pedestal 101. FIG. 4F shows the state of the substrate lifting system in operation 311, in accordance with some embodiments of the present invention. The downward movement of the lift ring 107 in operation 311 is represented by the arrow 407.

In operation 311, the lift pins 103A, 103B, 103C should move downward under the force of gravity as the lift ring 107 is moved downward. However, if the lift pins 103A, 103B, 103C get stuck as the lift ring 107 is moved downward in operation 311, an upper flange portion 230 of the handle engagement devices 106A, 106B, 106C will eventually contact a top surface of the handle members 220 and apply a downward force to the handle members 220 to pull the stuck lift pins 103A, 103B, 103C down by way of the linkage through the plunger portions 219 and the lift pin holder portions 218 of the lift pin assemblies 105A, 105B, 105C.

Figure 4G:
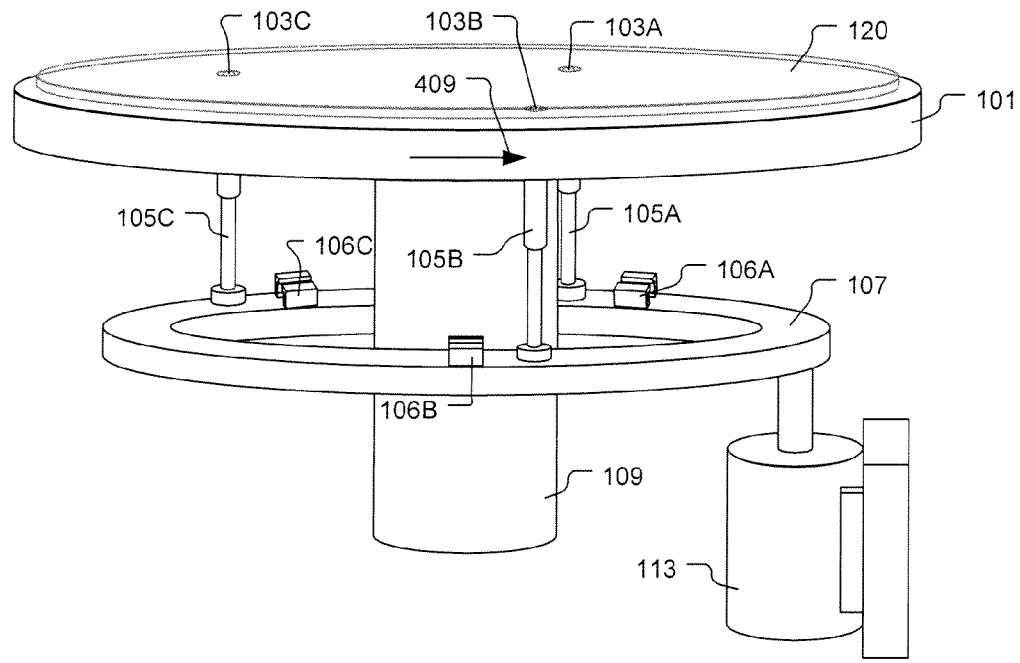
FIG. 4G shows the state of the substrate lifting system in operation 313 of the method of FIG. 3, in accordance with some embodiments of the present invention.

From the operation 311, the method continues with an operation 313 in which the pedestal 101 is rotated to move the handle members 220 of the lift pin assemblies 105A, 105B, 105C out of their corresponding handle engagement devices 106A, 106B, 106C. FIG. 4G shows the state of the substrate lifting system in operation 313, in accordance with some embodiments of the present invention. The rotation of the pedestal 101 in operation 313 is represented by the arrow 409.

Figure 4H:
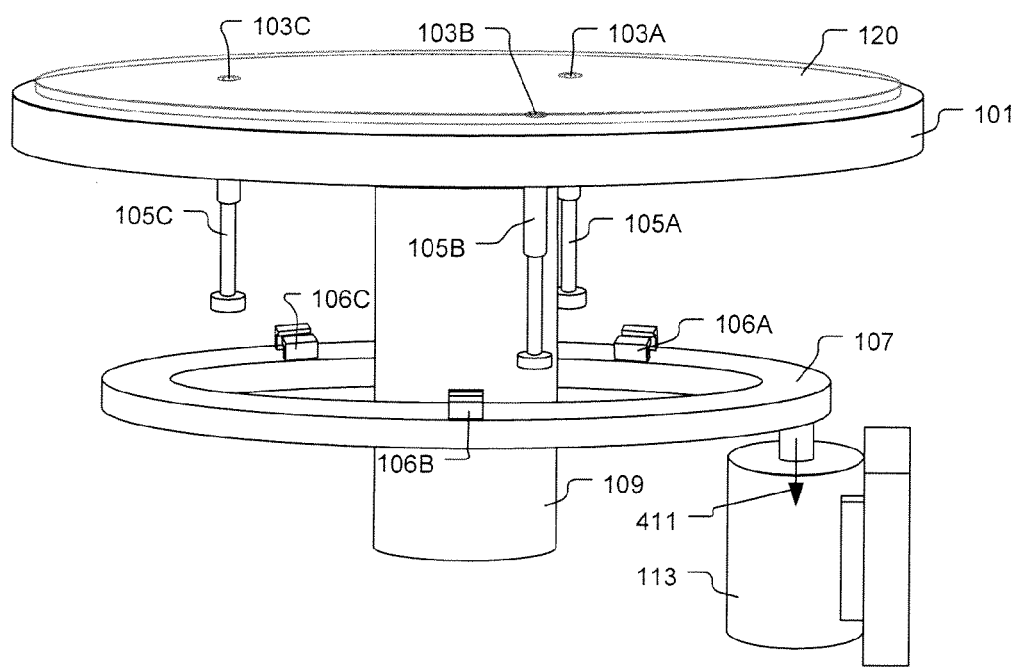
FIG. 4H shows the state of the substrate lifting system in operation 315 of the method of FIG. 3, in accordance with some embodiments of the present invention.

From the operation 313, the method continues with an operation 315 in which the lift ring 107 is moved downward to a position at which the handle engagement devices 106A, 106B, 106C are lower than the lift pin assemblies 105A, 105B, 105C, so as to provide an unobstructed path of travel for the lift pin assemblies 105A, 105B, 105C as the pedestal 101 is rotated. FIG. 4H shows the state of the substrate lifting system in operation 315, in accordance with some embodiments of the present invention. The downward movement of the lift ring 107 in operation 315 is represented by the arrow 411.

Figure 4I:
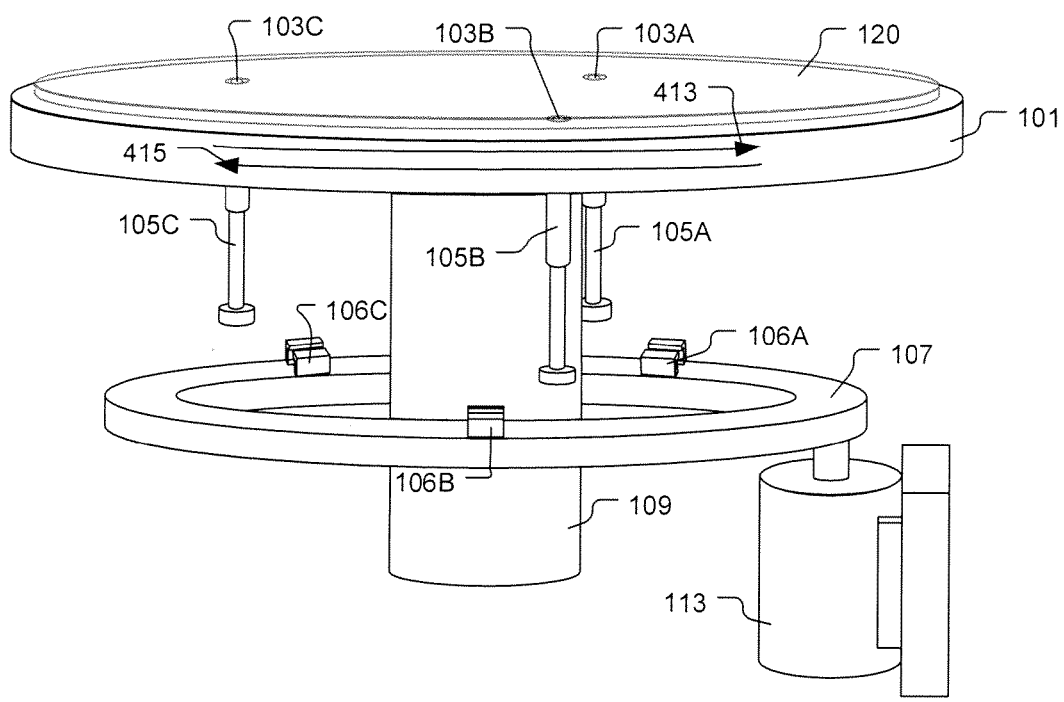
FIG. 4I shows the state of the substrate lifting system in operation 317 of the method of FIG. 3, in accordance with some embodiments of the present invention.

From the operation 315, the method continues with an operation 317 in which the substrate 120 is processed and in which the pedestal 101 is rotated as needed for processing of the substrate 120. During rotation of the pedestal 101, the lift pin assemblies 105A, 105B, 105C travel with the pedestal 101, while the lift ring 107 remains stationary. It should be understood that the lift pin assemblies 105A, 105B, 105C allow for both discrete and continuous rotation of the pedestal 101. FIG. 4I shows the state of the substrate lifting system in operation 317, in accordance with some embodiments of the present invention. The rotation of the pedestal 101 in operation 317 is represented by the arrows 413 and 415. Upon completion of the substrate 120 processing in operation 317, the operations 301 through 307 can be repeated to position the substrate 120 at the raised location above the pedestal 101 to provide for removal of the substrate 120 from the pedestal 101 by the end effector device.

Figure 5:
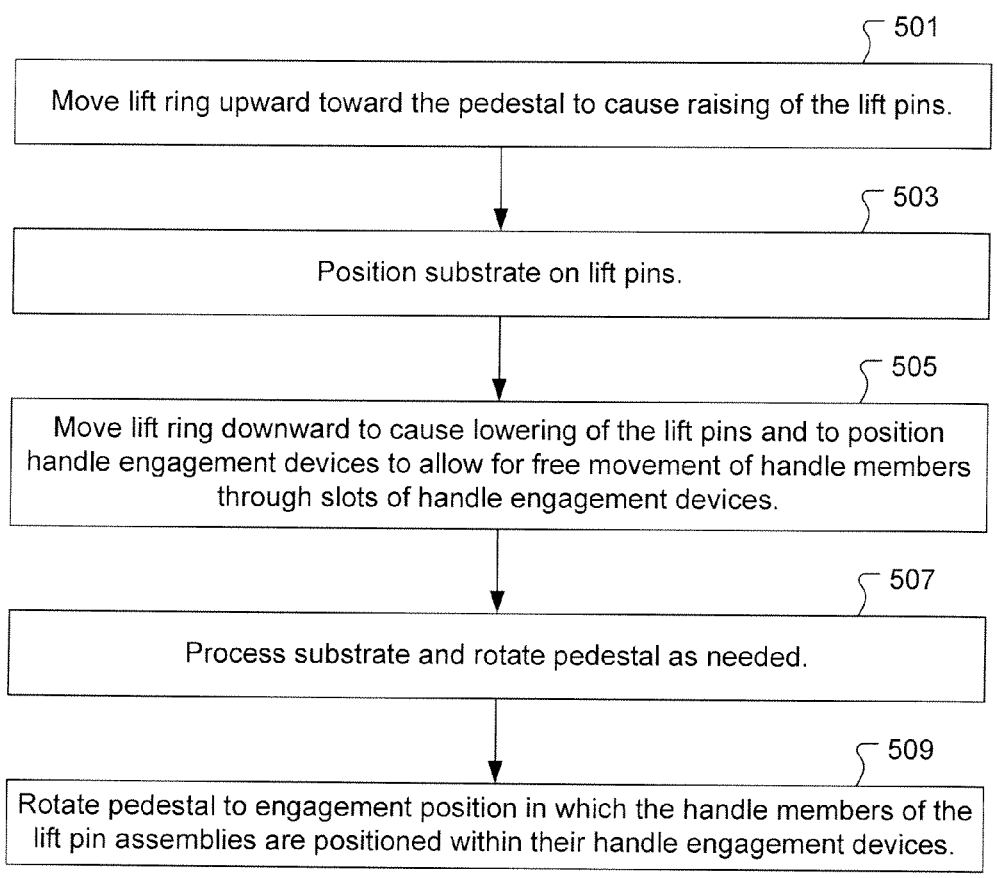
FIG. 5 shows a flowchart of a method for operating the substrate lifting system as described with regard to FIGS. 1A-2E, in accordance with various embodiments of the present invention.

FIG. 5 shows a flowchart of a method for operating the substrate lifting system as described with regard to FIGS. 1A-2E, in accordance with various embodiments of the present invention. FIGS. 6A-6E depict the substrate lifting system in various operations of the method of FIG. 5, in accordance with various embodiments of the present invention.

Figure 6A:
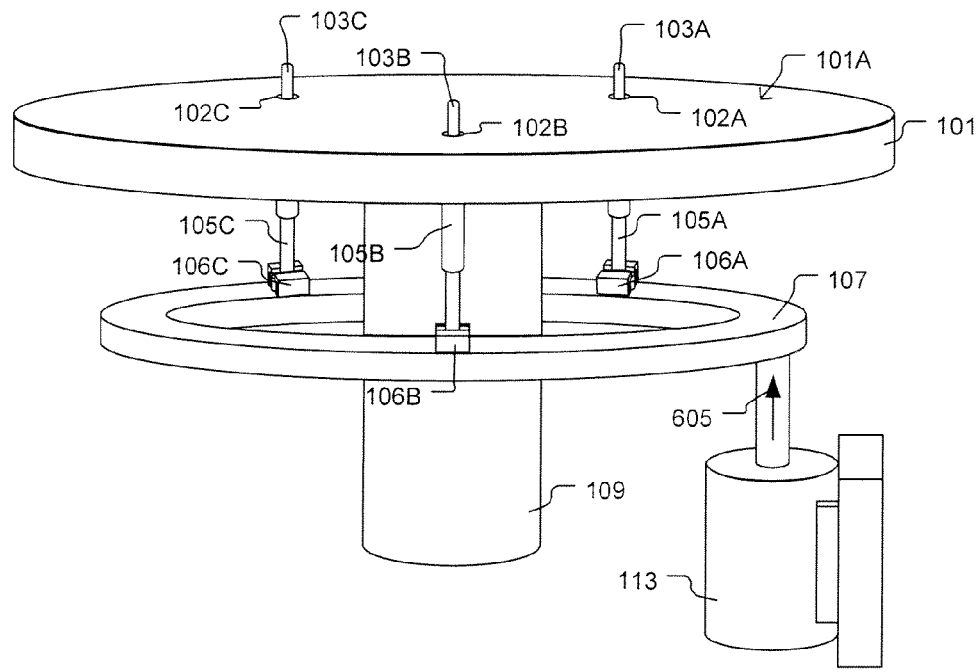
FIG. 6A shows the state of the substrate lifting system in operation 501, in accordance with some embodiments of the present invention.
Figure 6B:
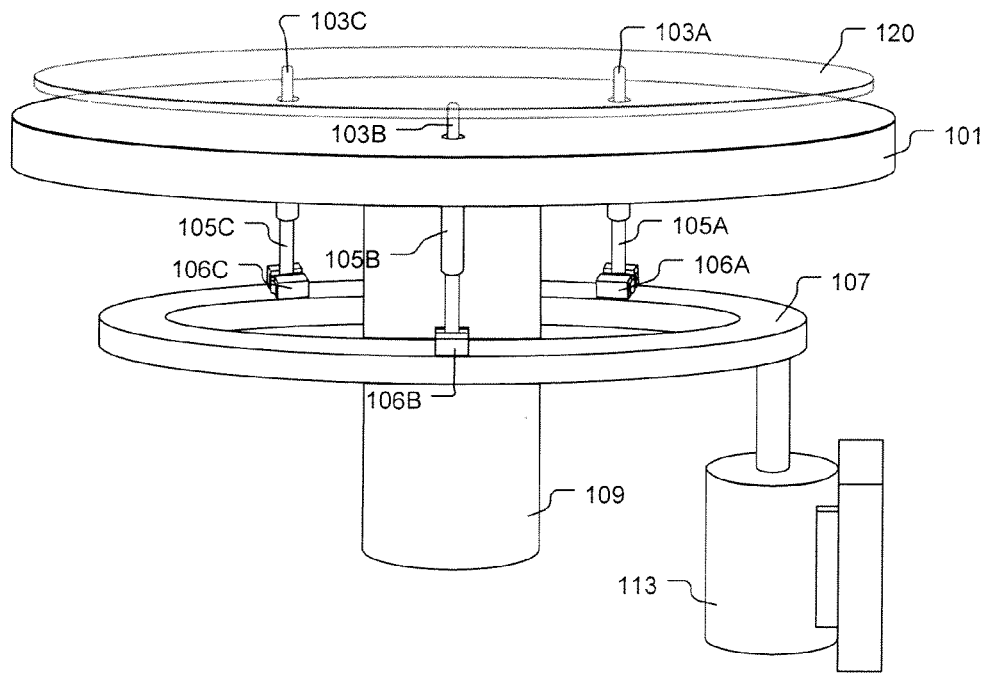
FIG. 6B shows the state of the substrate lifting system in operation 503, in accordance with some embodiments of the present invention.

The method of FIG. 5 includes an operation 501 in which the lift ring 107 is moved upward from the engagement plane of the handle members 220 of the lift pin assemblies 105A, 105B, 105C toward the pedestal 101, with the handle engagement devices 106A, 106B, 106C positioned to simultaneously and respectively engage the lift pin assemblies 105A, 105B, 105C causing simultaneous upward movement of the lift pins 103A, 103B, 103C above the top surface 101A of the pedestal 101. FIG. 6A shows the state of the substrate lifting system in operation 501, in accordance with some embodiments of the present invention. The upward movement of the lift ring 107 in operation 501 is represented by the arrow 605. From the operation 501, the method continues with an operation 503 in which the substrate 120 is positioned on the lift pins 103A, 103B, 103C. FIG. 6B shows the state of the substrate lifting system in operation 503, in accordance with some embodiments of the present invention.

Figure 6C:
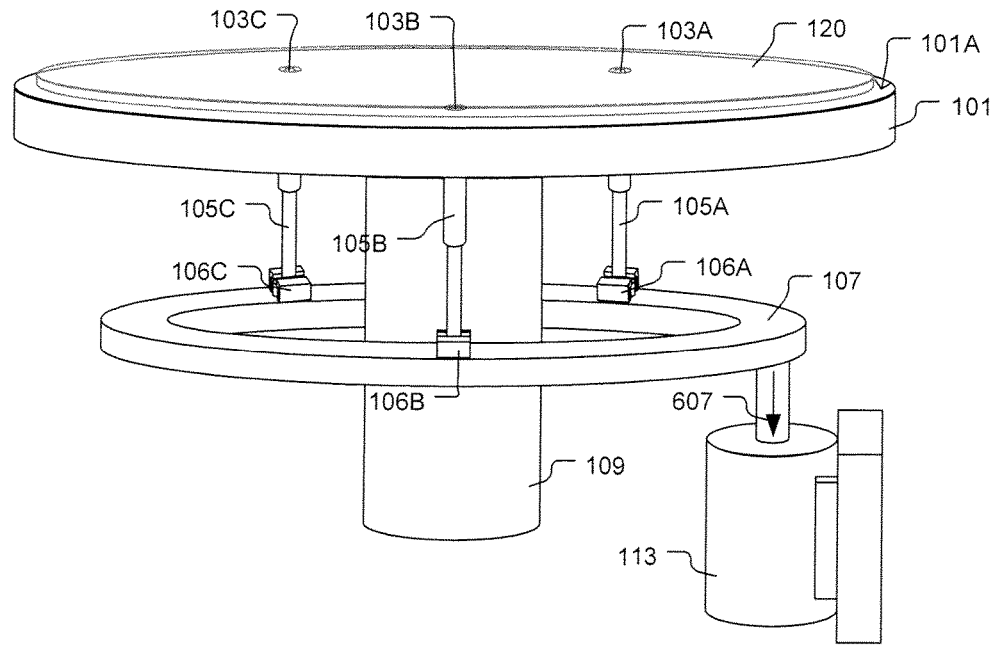
FIG. 6C shows the state of the substrate lifting system in operation 505, in accordance with some embodiments of the present invention.

From the operation 503, the method continues with an operation 505 in which the lift ring 107 is moved downward toward the engagement plane of the handle members 220 of the lift pin assemblies 105A, 105B, 105C, with the handle engagement devices 106A, 106B, 106C positioned to simultaneously and respectively engage the handle members 220 of the lift pin assemblies 105A, 105B, 105C to cause simultaneous downward movement of the lift pins 103A, 103B, 103C, such that the substrate 120 is brought to rest on the top surface 101A of the pedestal 101. FIG. 6C shows the state of the substrate lifting system in operation 505, in accordance with some embodiments of the present invention. The downward movement of the lift ring 107 in operation 505 is represented by the arrow 607.

In operation 505, the lift pins 103A, 103B, 103C should move downward under the force of gravity as the lift ring 107 is moved downward. However, if the lift pins 103A, 103B, 103C get stuck as the lift ring 107 is moved downward in operation 505, an upper flange portion 230 of the handle engagement devices 106A, 106B, 106C will eventually contact a top surface of the handle members 220 and apply a downward force to the handle members 220 to pull the stuck lift pins 103A, 103B, 103C down by way of the linkage through the plunger portions 219 and the lift pin holder portions 218 of the lift pin assemblies 105A, 105B, 105C.

In operation 505, the lift ring 107 is lowered to a position in which the handle members 220 of the lift pin assemblies 105A, 105B, 105C are positioned vertically away from the interior surfaces of their handle engagement devices 106A, 106B, 106C, respectively. More specifically, at the end of the downward vertical movement of the lift ring 107 in operation 505, the top surface of the handle members 220 of the lift pin assemblies 105A, 105B, 105C are positioned below and away from the bottom surface of the upper flange portion 230 of their respective handle engagement device 106A, 106B, 106C, and both the bottom surface of the handle members 220 and bottom end of the plunger portions 219 of the lift pin assemblies 105A, 105B, 105C are positioned above and away from the top surface of the lift ring 107 (and above and away from the top surface of the shim 221, if present). In this manner, as the plunger portions 219 and handle members 220 of the lift pin assemblies 105A, 105B, 105C move in orbit about the central axis 104 of rotation of the pedestal 101, the plunger portions 219 and handle members 220 of the lift pin assemblies 105A, 105B, 105C will travel freely through the slots 228 of the handle engagement devices 106A, 106B, 106C.

Figure 6D:
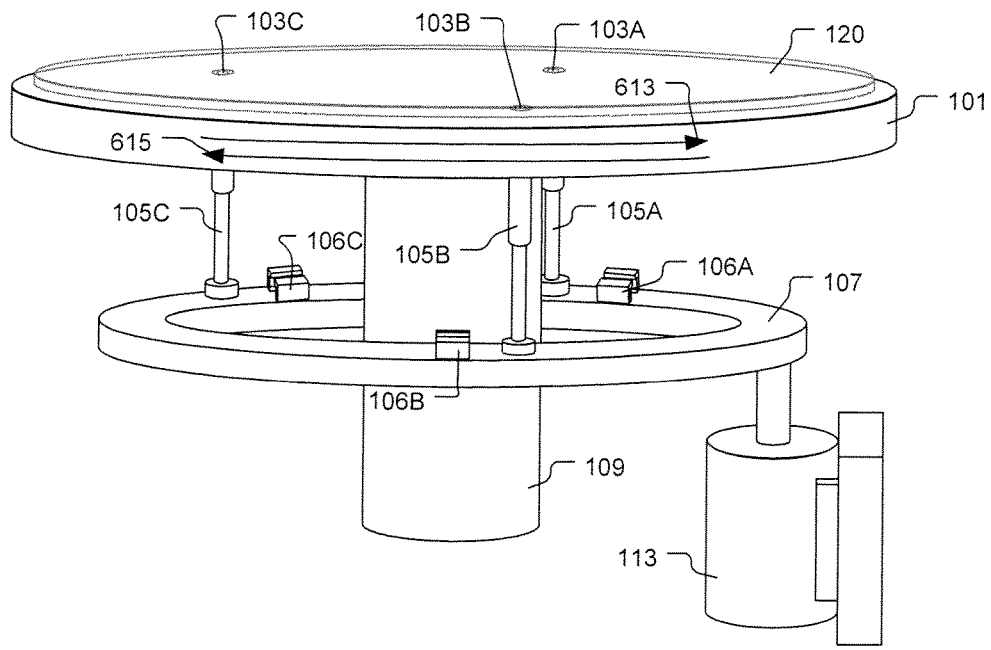
FIG. 6D shows the state of the substrate lifting system in operation 507, in accordance with some embodiments of the present invention.

From the operation 505, the method continues with an operation 507 in which the substrate 120 is processed and in which the pedestal 101 is rotated as needed for processing of the substrate 120. During rotation of the pedestal 101, the lift pin assemblies 105A, 105B, 105C travel with the pedestal 101 in orbit about the central axis 104 of rotation of the pedestal 101, while the lift ring 107 remains stationary. It should be understood that the lift pin assemblies 105A, 105B, 105C allow for both discrete and continuous rotation of the pedestal 101. FIG. 6D shows the state of the substrate lifting system in operation 507, in accordance with some embodiments of the present invention. The rotation of the pedestal 101 in operation 507 is represented by the arrows 613 and 615.

Figure 6E:
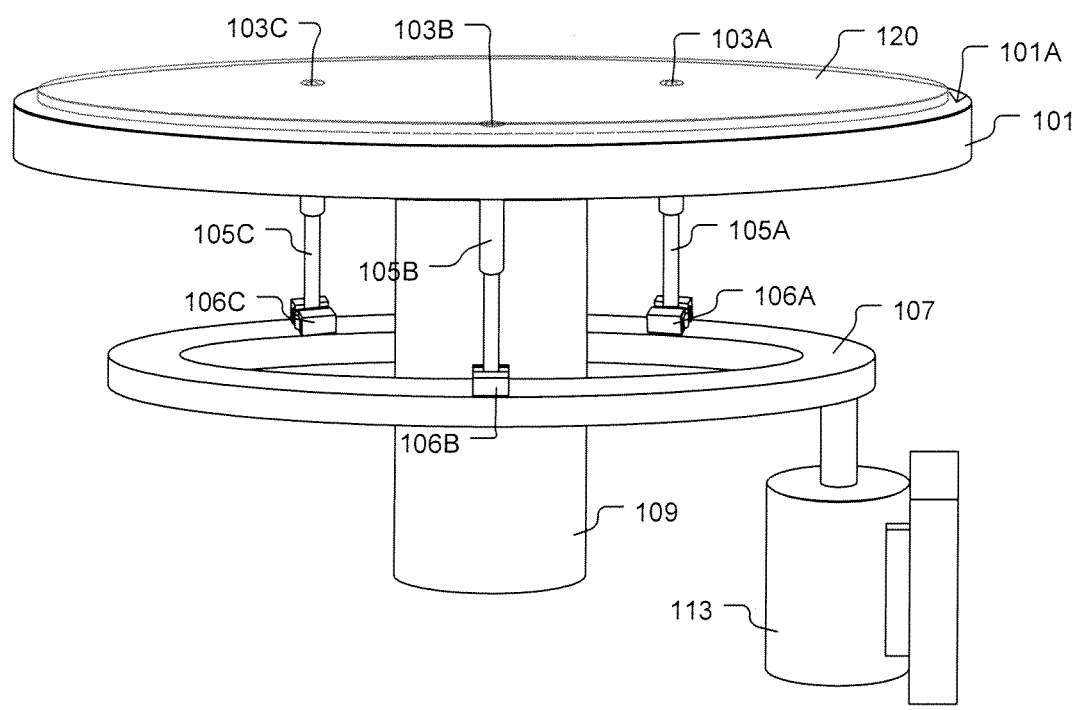
FIG. 6E shows the state of the substrate lifting system in operation 509, in accordance with some embodiments of the present invention.

Upon completion of the substrate 120 processing in operation 507, the method proceeds with an operation 509 in which the pedestal 101 is rotated to the engagement position in which the handle members 220 of the lift pin assemblies 105A, 105B, 105C are positioned within their respective handle engagement devices 106A, 106B, 106C. FIG. 6E shows the state of the substrate lifting system in operation 509, in accordance with some embodiments of the present invention. Following operation 509, operation 501 can be repeated to position the substrate 120 at the raised location above the pedestal 101 to provide for removal of the substrate 120 from the pedestal 101 by the end effector device.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A substrate lift pin assembly, comprising:
a tubular support member connected to a bottom surface of a pedestal at a location below a lift pin through-hole extending through the pedestal, the pedestal have a top surface configured to support a substrate, the tubular support member having an interior cavity exposed to the lift pin through-hole, the tubular support member having an end closure located at a distal end of the tubular support member relative to the pedestal, the end closure having a cartridge through-hole extending through the end closure;
a cartridge member including a lift pin holder portion and a plunger portion secured to the lift pin holder portion, the cartridge member partially disposed within the tubular support member such that the lift pin holder portion of the cartridge member is located inside of the interior cavity of the tubular support member and such that the plunger portion of the cartridge member extends from the lift pin holder portion of the cartridge member through the cartridge through-hole of the end closure of the tubular support member, the cartridge member sized such that the cartridge member is freely movable within the tubular support member in a direction extending between the end closure of the tubular support member and the pedestal;
a lift pin disposed to extend through the lift pin through-hole of the pedestal, the lift pin configured to connect in a secured manner to the lift pin holder portion of the cartridge member inside of the interior cavity of the tubular support member such that movement of the cartridge member causes corresponding movement of the lift pin, the lift pin configured to move freely through the lift pin through-hole of the pedestal; and
a handle member rigidly connected to the plunger portion of the cartridge member at a location near a distal end of the plunger portion of the cartridge member relative to the tubular support member, such that movement of the handle member causes corresponding movement of the cartridge member and corresponding movement of the lift pin, the handle member configured to engage with a lifting mechanism and disengage from the lifting mechanism.

2. The substrate lift pin assembly as recited in claim 1, wherein the tubular support member includes a guide portion and a retainer portion, the guide portion having a first end and a second end, the first end of the guide portion attachable to the bottom surface of the pedestal and detachable from the bottom surface of the pedestal, the retainer portion having a first end and a second end, the first end of the retainer portion attachable to the second end of the guide portion and detachable from the second end of the guide portion, the second end of the retainer portion having the end closure of the tubular support member.

3. The substrate lift pin assembly as recited in claim 2, wherein the first end of the guide portion is configured to have a threaded connection with the pedestal.

4. The substrate lift pin assembly as recited in claim 2, wherein the second end of the guide portion and the first end of the retainer portion are configured to have a threaded connection with each other.

5. The substrate lift pin assembly as recited in claim 1, wherein the substrate lift pin assembly is configured to move with the pedestal as the pedestal is rotated.

6. The substrate lift pin assembly as recited in claim 1, wherein the lift pin holder portion of the cartridge member is sized larger than the cartridge through-hole of the end closure of the tubular support member such that the end closure of the tubular support member is a hard stop to movement of the lift pin holder portion of the cartridge member within the interior cavity of the tubular support member.

7. The substrate lift pin assembly as recited in claim 1, wherein the plunger portion of the cartridge member is sized smaller than the cartridge through-hole of the end closure of the tubular support member such that the plunger portion of the cartridge member is freely movable through the cartridge through-hole of the end closure of the tubular support member.

8. The substrate lift pin assembly as recited in claim 1, wherein the lift pin holder portion of the cartridge member is secured to the plunger portion of the cartridge member by a threaded connection.

9. The substrate lift pin assembly as recited in claim 1, wherein the lift pin holder portion of the cartridge member includes a receptacle configured to provide a snap-in connection with the lift pin.

10. The substrate lift pin assembly as recited in claim 9, wherein the receptacle has a funnel shaped opening for receipt of the lift pin.

11. The substrate lift pin assembly as recited in claim 10, wherein a portion of the lift pin configured to engage the receptacle includes a channel defined to circumscribe the lift pin, and wherein the receptacle includes a number of locking tabs configured to engage the channel of the lift pin to provide the snap-in connection with the lift pin, and wherein the funnel shaped opening of the receptacle is fluted to impart flexibility to the receptacle to enable insertion of the lift pin within the receptacle.

12. The substrate lift pin assembly as recited in claim 1, wherein the tubular support member includes a number of slots formed through a sidewall of the tubular support member at a location near the distal end of the tubular support member relative to the pedestal, the number of slots providing a corresponding number of fluid pathways between the interior cavity of the tubular support member and an environment outside of the tubular support member.

13. The substrate lift pin assembly as recited in claim 1, wherein the handle member is configured to enter a slot of the lifting mechanism as the substrate lift pin assembly is moved in conjunction with rotation of the pedestal, and wherein, the handle member is configured to exit the slot of the lifting mechanism as the substrate lift pin assembly is moved in conjunction with rotation of the pedestal.

14. The substrate lift pin assembly as recited in claim 1, wherein the handle member is connected to the plunger portion of the cartridge member by a threaded connection.

15. A substrate lifting system, comprising:
a pedestal having a top surface and a bottom surface, the top surface of the pedestal configured to support a substrate, the pedestal configured to rotate about a central axis extending perpendicular to the top surface of the pedestal, the pedestal including at least three lift pin through-holes extending perpendicular to the top surface of the pedestal;
at least three lift pin assemblies connected to the bottom surface of the pedestal at locations respectively corresponding to the at least three lift pin through-holes of the pedestal, each lift pin assembly including a lift pin connected to a cartridge member with a lift pin holder portion of the cartridge member disposed within a tubular support member and with a plunger portion of the cartridge member extending through a cartridge through-hole formed within an end closure of the tubular support member and with a handle member rigidly connected to the plunger portion of the cartridge member at a location near a distal end of the plunger portion of the cartridge member relative to the pedestal, wherein the cartridge member is freely movable within the tubular support member in a direction extending between the end closure of the tubular support member and the pedestal;

a lift ring positioned to circumscribe the central axis about which the pedestal is configured to rotate, the lift ring including at least three handle engagement devices positioned to simultaneously and respectively engage the handle members of the at least three lift pin assemblies when the lift ring is positioned at an engagement plane of the handle members of the at least three lift pin assemblies and when the pedestal is rotated to respectively insert the handle members of the at least three lift pin assemblies into the at least three handle engagement devices; and a lift ring actuator configured to provide controlled movement of the lift ring in a direction parallel to the central axis about which the pedestal is configured to rotate, wherein the pedestal and the lift ring are configured to move independently with respect to each other.

16. The system as recited in claim 15, wherein the engagement plane of the handle members of the at least three lift pin assemblies corresponds to a location of the handle members of the at least three lift pin assemblies when the lift pin holder portions of the cartridge members of the at least three lift pin assemblies are in contact with the respective end closures of the tubular support members of the at least three lift pin assemblies.

17. The system as recited in claim 16, wherein upward movement of the lift ring from the engagement plane of the handle members of the at least three lift pin assemblies toward the pedestal with the at least three handle engagement devices positioned to simultaneously and respectively engage the at least three lift pin assemblies causes simultaneous upward movement of the lift pins of the at least three lift pin assemblies above the top surface of the pedestal, and wherein downward movement of the lift ring toward the engagement plane of the handle members of the at least three lift pin assemblies with the at least three handle engagement devices positioned to simultaneously and respectively engage the handle members of the at least three lift pin assemblies causes simultaneous downward movement of the lift pins of the at least three lift pin assemblies.

18. A method for operating a substrate lifting system, comprising:

having the substrate lifting system, the substrate lifting system including a pedestal having a top surface and a bottom surface, the top surface of the pedestal configured to support a substrate, the pedestal configured to rotate about a central axis extending perpendicular to the top surface of the pedestal, the pedestal including at least three lift pin through-holes extending perpendicular to the top surface of the pedestal, the substrate lifting system including at least three lift pin assemblies connected to the bottom surface of the pedestal at locations respectively corresponding to the at least three lift pin through-holes of the pedestal, each lift pin assembly including a lift pin connected to a cartridge member with a lift pin holder portion of the cartridge member disposed within a tubular support member and with a plunger portion of the cartridge member extending through a cartridge through-hole formed within an end closure of the tubular support member and with a handle member rigidly connected to the plunger portion of the cartridge member at a location near a distal end of the plunger portion of the cartridge member relative to the pedestal, wherein the cartridge member is freely movable within the tubular support member in a direction extending between the end closure of the tubular support member and the pedestal, the substrate lifting system including a lift ring positioned to circumscribe the central axis about which the pedestal is configured to rotate, the lift ring including at least three handle engagement devices positioned to simultaneously and respectively engage the handle members of the at least three lift pin assemblies when the lift ring is positioned at an engagement plane of the handle members of the at least three lift pin assemblies and when the pedestal is rotated to respectively insert the handle members of the at least three lift pin assemblies into the at least three handle engagement devices, the substrate lifting system including a lift ring actuator configured to provide controlled movement of the lift ring in a direction parallel to the central axis about which the pedestal is configured to rotate, wherein the pedestal and the lift ring are configured to move independently with respect to each other;

rotating the pedestal to a position at which the handle members of the at least three lift pin assemblies are rotationally and respectively offset from the at least three handle engagement devices of the lift ring;

moving the lift ring toward the pedestal in a direction parallel to the central axis about which the pedestal is configured to rotate so as to position the lift ring at an engagement plane of the handle members of the at least three lift pin assemblies;

rotating the pedestal to cause the handle members of the at least three lift pin assemblies to respectively engage with the at least three handle engagement devices of the lift ring; and moving the lift ring toward the pedestal in a direction parallel to the central axis about which the pedestal is configured to rotate so as to cause the lift pins of the at least three lift pin assemblies to simultaneously move upward to a position above the top surface of the pedestal.

19. The method for operating the substrate lifting system as recited in claim 18, wherein the engagement plane of the handle members of the at least three lift pin assemblies corresponds to a location of the handle members of the at least three lift pin assemblies when the lift pin holder portions of the cartridge members of the at least three lift pin assemblies are in contact with the respective end closures of the tubular support members of the at least three lift pin assemblies.

20. The method for operating the substrate lifting system as recited in claim 18, wherein each of the handle members of the at least three lift pin assemblies engages its handle engagement device of the lift ring by entering a slot within its handle engagement device as the pedestal is rotated.

21. The method for operating the substrate lifting system as recited in claim 18, further comprising:

moving the lift ring away from the pedestal in the direction parallel to the central axis about which the pedestal is configured to rotate so as to cause the lift pins of the at least three lift pin assemblies to simultaneously move downward to a position below the top surface of the pedestal and so as to position the lift ring at the engagement plane of the handle members of the at least three lift pin assemblies;

rotating the pedestal to cause the handle members of the at least three lift pin assemblies to respectively disengage from the at least three handle engagement devices of the lift ring; and moving the lift ring away from the pedestal in the direction parallel to the central axis about which the pedestal is configured to rotate so as to position the handle engagement devices of the lift ring at a location that does not interfere with movement of the at least three lift pin assemblies due to rotation of the pedestal.

22. A method for operating a substrate lifting system, comprising:

having the substrate lifting system, the substrate lifting system including a pedestal having a top surface and a bottom surface, the top surface of the pedestal configured to support a substrate, the pedestal configured to rotate about a central axis extending perpendicular to the top surface of the pedestal, the pedestal including at least three lift pin through-holes extending perpendicular to the top surface of the pedestal, the substrate lifting system including at least three lift pin assemblies connected to the bottom surface of the pedestal at locations respectively corresponding to the at least three lift pin through-holes of the pedestal, each lift pin assembly including a lift pin connected to a cartridge member with a lift pin holder portion of the cartridge member disposed within a tubular support member and with a plunger portion of the cartridge member extending through a cartridge through-hole formed within an end closure of the tubular support member and with a handle member rigidly connected to the plunger portion of the cartridge member at a location near a distal end of the plunger portion of the cartridge member relative to the pedestal, wherein the cartridge member is freely movable within the tubular support member in a direction extending between the end closure of the tubular support member and the pedestal, the substrate lifting system including a lift ring positioned to circumscribe the central axis about which the pedestal is configured to rotate, the lift ring including at least three handle engagement devices positioned to simultaneously and respectively engage the handle members of the at least three lift pin assemblies when the lift ring is positioned at an engagement plane of the handle members of the at least three lift pin assemblies and when the pedestal is rotated to respectively insert the handle members of the at least three lift pin assemblies into the at least three handle engagement devices, the substrate lifting system including a lift ring actuator configured to provide controlled movement of the lift ring in a direction parallel to the central axis about which the pedestal is configured to rotate, wherein the pedestal and the lift ring are configured to move independently with respect to each other;

rotating the pedestal to a position at which the handle members of the at least three lift pin assemblies are positioned to respectively engage with the at least three handle engagement devices of the lift ring;

moving the lift ring toward the pedestal in a direction parallel to the central axis about which the pedestal is configured to rotate so as to cause movement of the lift pins of the at least three lift pin assemblies to a position above the pedestal;

positioning a substrate on the lift pins of the at least three lift pin assemblies;

moving the lift ring away from the pedestal in the direction parallel to the central axis about which the pedestal is configured to rotate so as to cause retraction of the lift pins of the at least three lift pin assemblies into the lift pin through-holes of the pedestal;

positioning the lift ring so that each of the handle members of the at least three lift pin assemblies is positioned within a slot of its handle engagement device and vertically away from interior surfaces of its handle engagement device; and rotating the pedestal such that the handle members of the at least three lift pin assemblies move freely through the slots of the at least three handle engagement devices.

23. The method for operating the substrate lifting system as recited in claim 22, wherein moving the lift ring away from the pedestal in the direction parallel to the central axis about which the pedestal is configured to rotate allows the lift pins of the at least three lift pin assemblies to retract into the lift pin through-holes of the pedestal under a force of gravity, and wherein moving the lift ring away from the pedestal in the direction parallel to the central axis about which the pedestal is configured to rotate provides for engagement of any of the handle members of at least three lift pin assemblies by its corresponding one of the at least three handle engagement devices of the lift ring when its corresponding lift pin becomes stuck.

* * * * *